(12) United States Patent
Gupta

(10) Patent No.: US 6,809,672 B2
(45) Date of Patent: Oct. 26, 2004

(54) LOW POWER, HIGH SNR, HIGH ORDER DELTA SIGMA MODULATOR STAGE HAVING INTEGRATORS WITH PIPELINED CROSS COUPLED INPUT CIRCUITS

(75) Inventor: Sandeep K. Gupta, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/394,196

(22) Filed: Mar. 24, 2003

(65) Prior Publication Data

US 2003/0179121 A1 Sep. 25, 2003

Related U.S. Application Data

(60) Provisional application No. 60/366,261, filed on Mar. 22, 2002.

(51) Int. Cl.[7] .............................................. H03M 3/00
(52) U.S. Cl. ....................................... 341/143; 341/172
(58) Field of Search ................................ 341/143, 144, 341/172, 118, 120, 145

(56) References Cited

U.S. PATENT DOCUMENTS 5,030,954 A * 7/1991 Ribner ........................ 341/172
6,535,153 B1 * 3/2003 Zierhofer .................... 341/143
6,577,259 B1 * 6/2003 Jelonnek ..................... 341/143

OTHER PUBLICATIONS

Adams, R.W., "The Design of High–Order Single–Bit ΔΣ ADCs," from Norsworthy, S.R. et al. (editors), *Delta–Sigma Data Converters*, IEEE Press, pp. v–xiv and 165–191 (1997).

Aziz, P.M. et al., "An Overview of Sigma–Delta Converters," *IEEE Signal Processing Magazine*, IEEE, pp. 61–84 (Jan. 1996).

(List continued on next page.)

*Primary Examiner*—Brian Young
*Assistant Examiner*—Joseph Lauture
(74) *Attorney, Agent, or Firm*—Sterne, Kessler Goldstein & Fox P.L.L.C.

(57) ABSTRACT

In a high order delta sigma modulator stage having integrators with pipelined cross coupled input circuits, the processing delay between an upstream integrator and a downstream integrator is decreased from a full cycle of a clock used to control the high order delta sigma modulator stage to a half cycle of the clock, while the processing delay between a quantizer and a portion of a digital-to-analog converter that provides feedback to the upstream integrator is increased by a half cycle of the clock. This configuration: (1) eliminates poles from the transfer function that defines processing of a signal by the high order delta sigma modulator stage, (2) reduces the power consumed by the high order delta sigma modulator stage for a given settling time requirement, (3) facilitates reducing the size of the summing junction switches in the high order delta sigma modulator stage to decrease distortions due to charge injections, and (4) allows a reference signal voltage, which is coupled to a cross coupled feedback switched capacitor network in the integrators, to be set equal to one of two power supply voltages for the high order delta sigma modulator stage, thereby further reducing the power consumed by the delta sigma modulator.

22 Claims, 19 Drawing Sheets

OTHER PUBLICATIONS

Brandt, B., *High–Speed Cascaded ΔE ADCs*, from Norsworthy, S.R. et al. (editors), *Delta–Sigma Data Converters*, IEEE Press, pp. v–xiv and 219–243 (1997).

Brandt, B.P. and Wooley, B.A., "A 50–MHz Multibit Sigma–Delta Modulator for 12–b 2–MHz A/D Conversion," *IEEE Journal of Solid–State Circuits*, IEEE, vol. 26, No. 12, pp. 1746–1756 (Dec. 1991).

Brandt, B.P. et al., *Analog Circuit Design for ΔE ADCs*, from Norsworthy, S.R. et al. (editors), *Delta–Sigma Data Converters*, IEEE Press, pp. v–xiv and 334–348 (1997).

Candy, J.C., *An Overview of Basic Concepts*, from Norsworthy, S.R. et al. (editors), *Delta–Sigma Data Converters*, IEEE Press, pp. v–xiv and 1–43 (1997).

Carley, R.L. et al., *Delta–Sigma ADCs with Multibit Internal Converters*, from Norsworthy, S.R. et al. (editors), *Delta–Sigma Data Converters*, IEEE Press, pp. v–xiv and 244–281 (1997).

DSPatch, Special Reprint Edition, Analog Devices, Inc., 16 pages (Winter 1990).

Noriega, G., *Sigma–Delta A/D Converters—Audio and Medium Bandwidths*, RMS Instruments, from http://www.rmsinst.com/dt3.htm, 7 pages (Feb. 1996).

Rebeschini, M., *The Design of Cascaded ΔE ADCs*, from Norsworthy, S.R. et al. (editors), *Delta–Sigma Data Converters*, IEEE Press, pp. v–xiv and 192–217 (1997).

Ribner, D.R., "A Comparison of Modulator Networks for High–Order Oversampled EΔ Analog–to–Digital Converters," *IEEE Transactions on Circuits and Systems*, IEEE Circuits and Systems Society, vol. 38, No. 2, pp. 145–159 (Feb. 1991).

Copy of International Search Report for Appln. No. PCT/US03/08837, mailed Sep. 4, 2003, 5 pages.

* cited by examiner

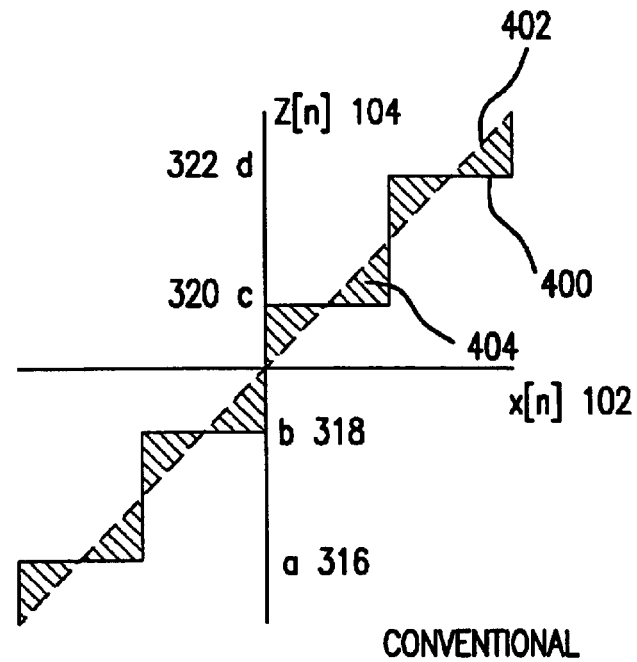
CONVENTIONAL
FIG.4
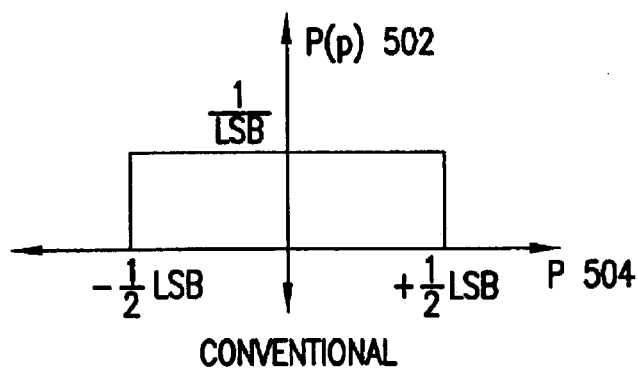
CONVENTIONAL
FIG.5
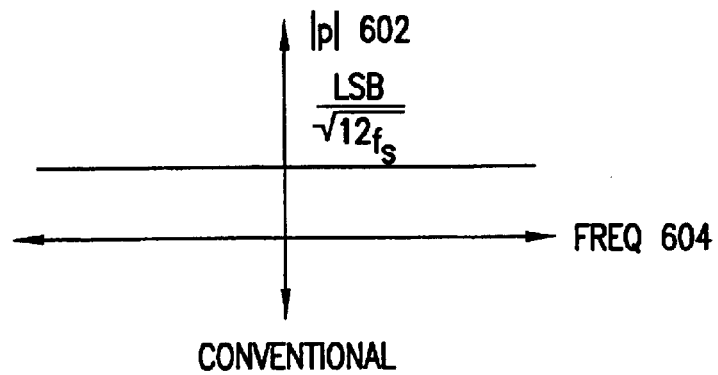
CONVENTIONAL
FIG.6

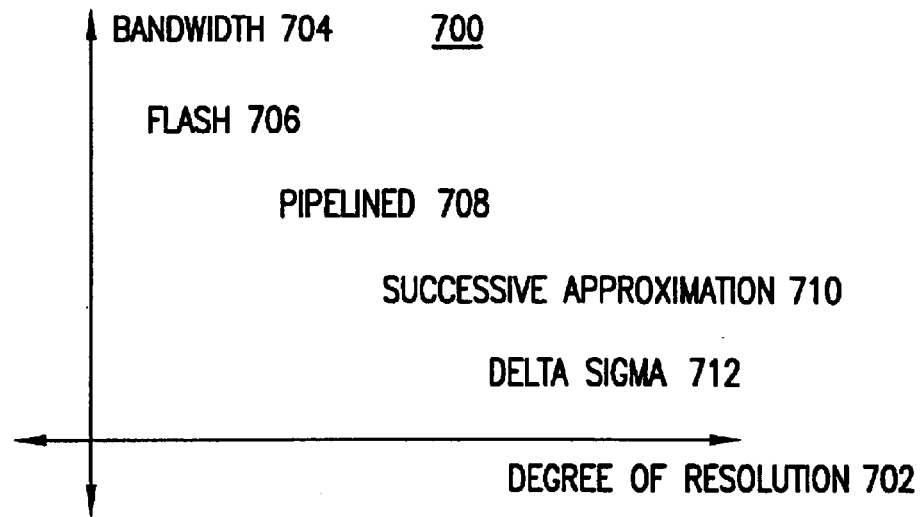
FIG. 7 CONVENTIONAL
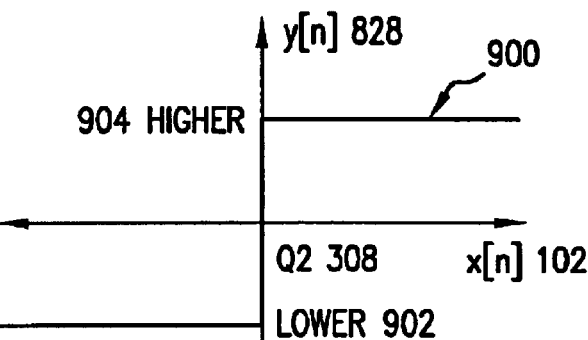
FIG. 9 CONVENTIONAL
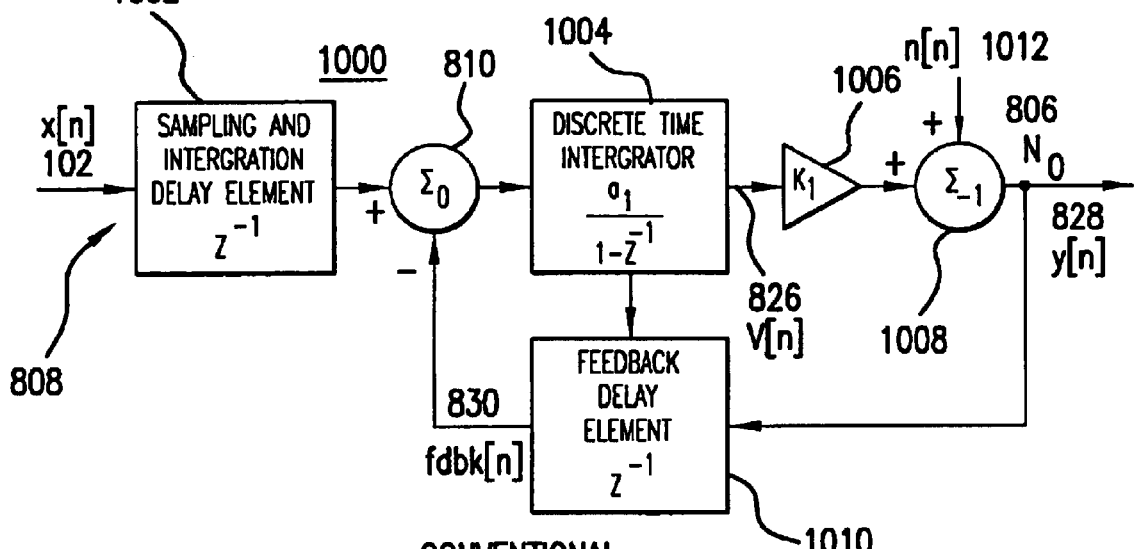
CONVENTIONAL
FIG. 10

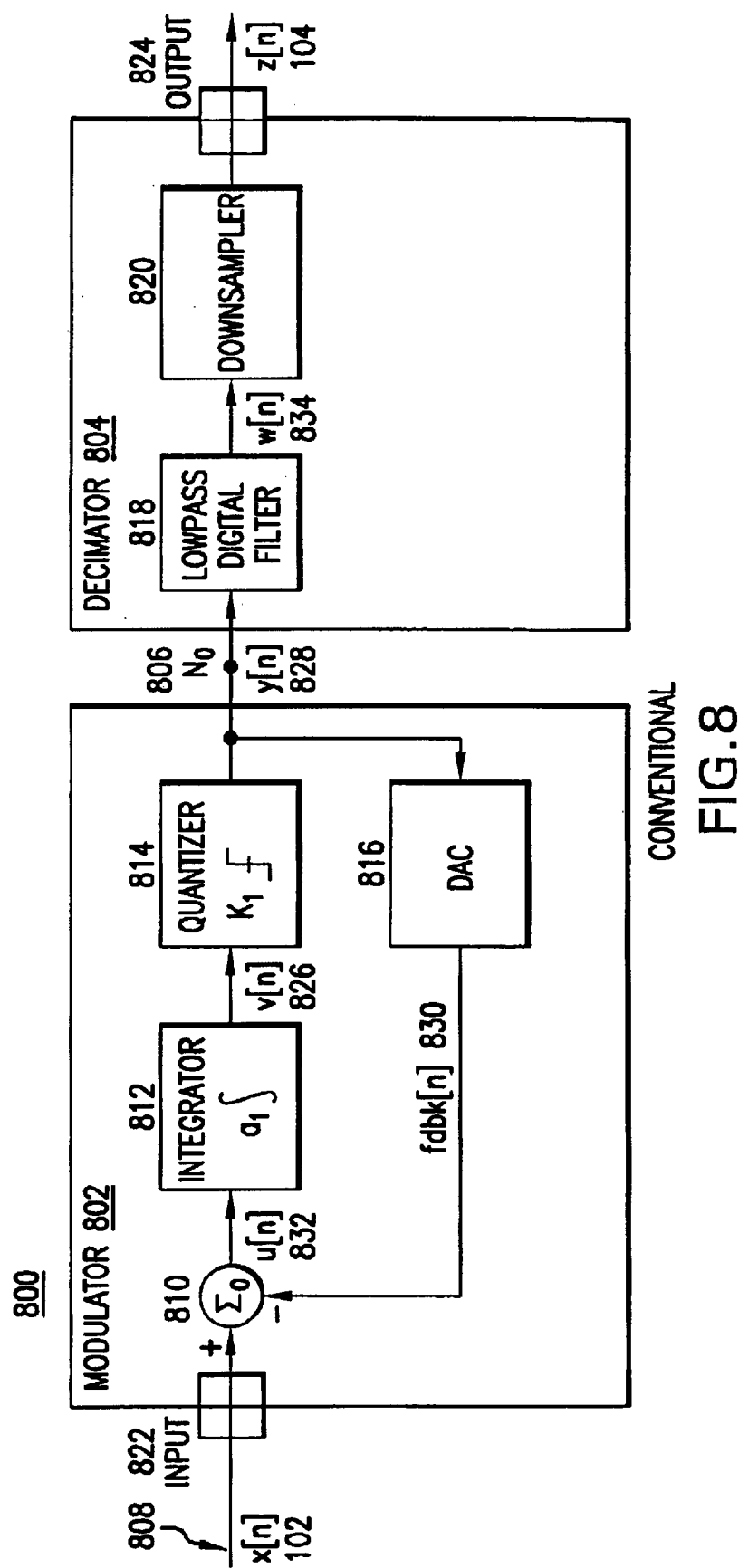
FIG. 8
CONVENTIONAL

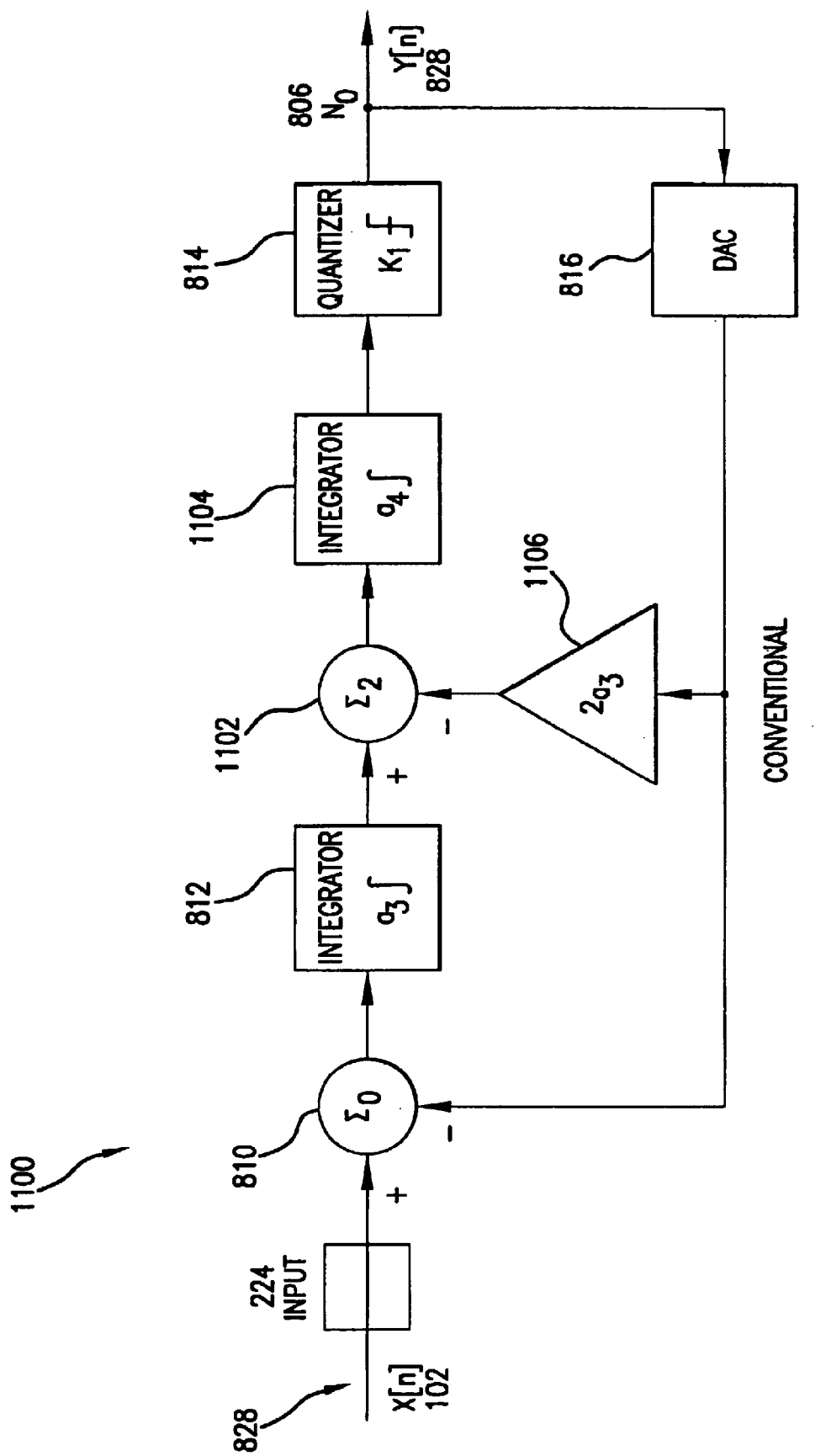
FIG. 11
CONVENTIONAL

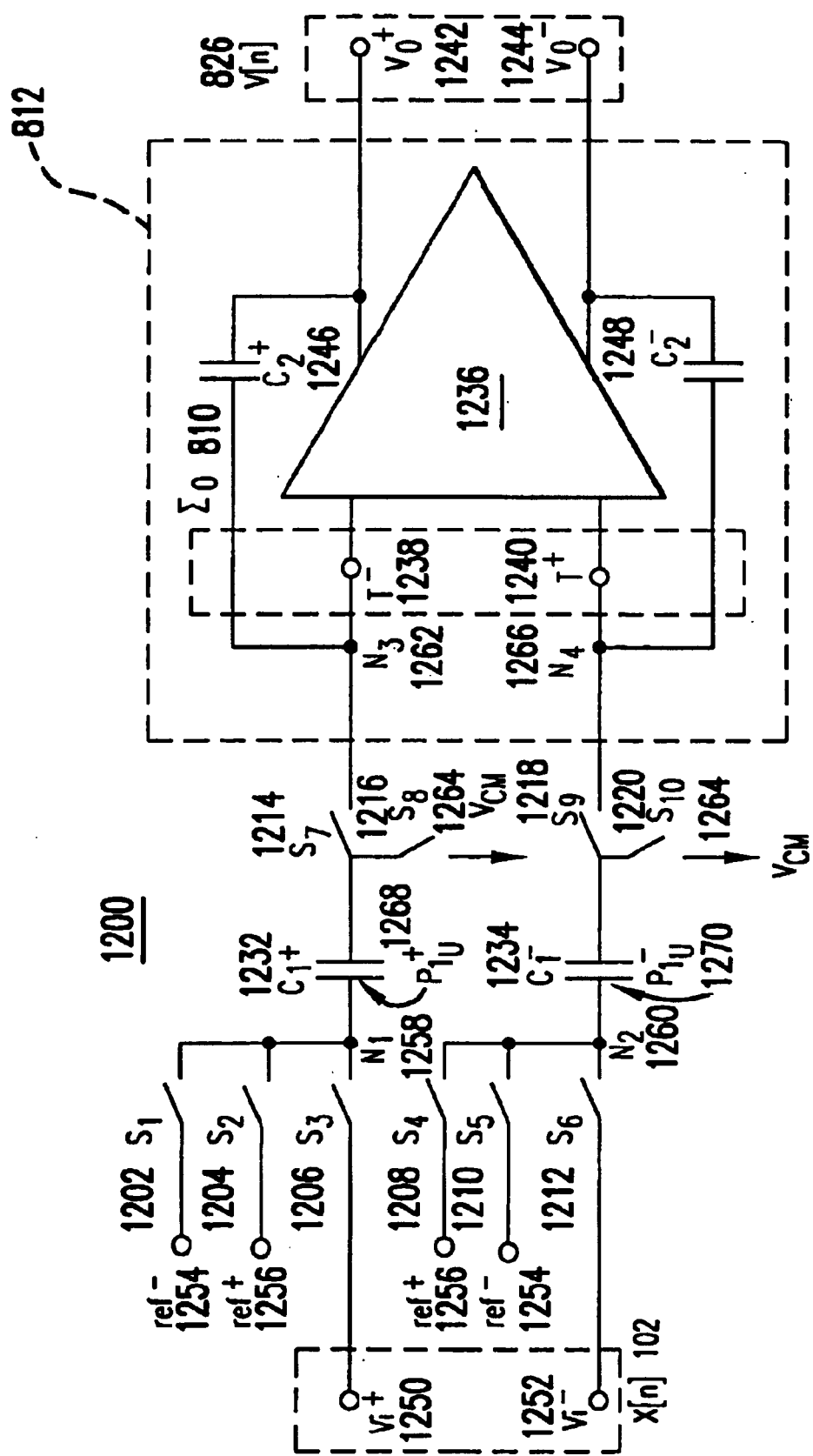
FIG. 12A
CONVENTIONAL

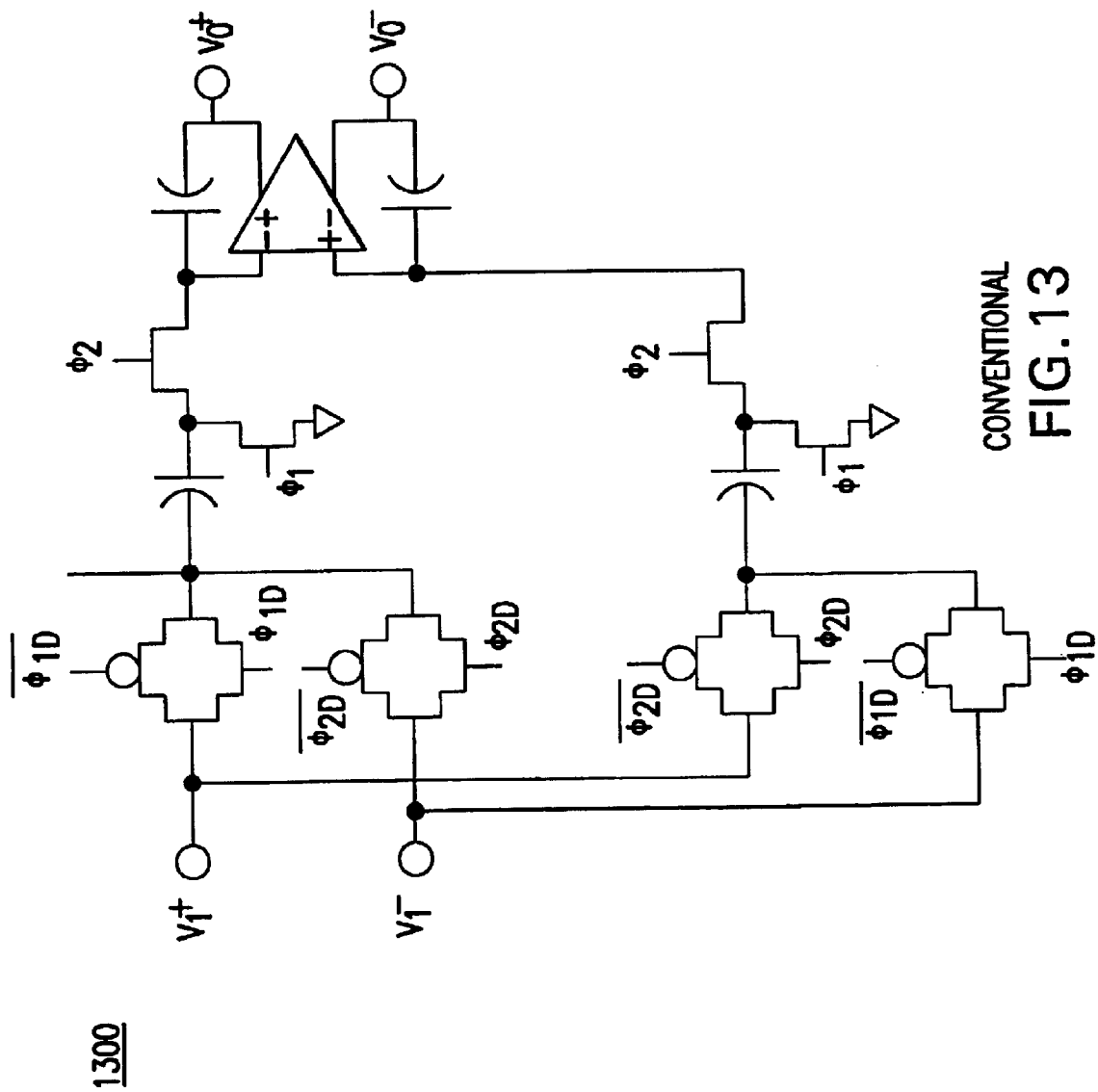
CONVENTIONAL
FIG. 13

1700

1702 CAUSE A FIRST INTEGRATOR TO SAMPLE DURING A FIRST PHASE OF A CLOCK AND TO SAMPLE AND INTEGRATE DURING A SECOND PHASE OF THE CLOCK

1704 CAUSE A SECOND INTEGRATOR TO SAMPLE AND INTEGRATE DURING A FIRST PHASE OF THE CLOCK AND TO SAMPLE DURING A SECOND PHASE OF THE CLOCK

1706 SET A REFERENCE VOLTAGE, WHICH IS COUPLED TO A TRANSISTOR SUMMING JUNCTION SWITCH IN THE INTEGRATORS, LESS THAN AN AVERAGE OF TWO POWER SUPPLY VOLTAGES FOR THE HIGH ORDER DELTA SIGMA MODULATOR STAGE

FIG. 17

LOW POWER, HIGH SNR, HIGH ORDER DELTA SIGMA MODULATOR STAGE HAVING INTEGRATORS WITH PIPELINED CROSS COUPLED INPUT CIRCUITS

CROSS-REFERENCE TO RELATED APPLICATIONS

This application claims the benefit of U.S. Provisional Application No. 60/366,261, filed Mar. 22, 2002, which is incorporated herein by reference in its entirety.

BACKGROUND OF THE INVENTION

1. Field of the Invention

The present invention relates to a low power, high signal-to-noise ratio (SNR), high order delta sigma modulator stage having integrators with pipelined cross coupled input circuits.

2. Background Art

Commercialization of the Internet has proven to be a mainspring for incentives to improve network technologies. Development programs have pursued various approaches including strategies to leverage use of the existing Public Switched Telephone Network and plans to expand use of wireless technologies for networking applications. Both of these approaches (and others) entail the conversion of data between analog and digital formats. Therefore, it is expected that analog-to-digital converters (ADCs) and digital-to-analog converters (DACs) will continue to perform critical functions in many network applications.

FIG. 1 shows a process for converting an analog signal "x[n]" 102 to a digital signal "z[n]" 104 using an exemplary ADC 106. ADC 106 receives analog signal x[n] 102 and produces digital signal z[n] 104. Analog signal x[n] 102 comprises variations of a parameter (e.g., voltage) continuously with time. The variations in the parameter of analog signal x[n] 102 are maintained within a range between a lower value "LOW" 108 and a higher value "HIGH" 110. This is referred to as the "swing" of analog signal x[n] 102. Typically, analog signal x[n] 102 is characterized by a carrier frequency. Digital signal z[n] 104 comprises a sequence of discrete quantized values that, over time, tracks the parameter variations of analog signal x[n] 102. Typically, the quantized values of digital signal z[n] 104 are represented by binary numbers. A maximum value "MAX" 112 is defined by the number of different quantized values that can be produced by ADC 106.

FIG. 2 is a block diagram of ADC 106. ADC 106 comprises a sampling functional component 202 and a quantization functional component 204. Sampling functional component 202 records, at a sampling frequency, discrete values of analog signal x[n] 102. Typically, the sampling frequency is greater than or equal to the Nyquist frequency, which is twice the carrier frequency of analog signal x[n] 102. Quantization functional component 204 assigns a quantized value to represent each discrete sampled value, thereby producing digital signal z[n] 104.

The difference between digital signal z[n] 104 and analog signal x[n] 102 is referred to as quantization error e[n]. Ideally, there is a direct relationship between the values of analog signal x[n] 102 and digital signal z[n] 104 at corresponding points in time. In reality, the use of a limited number of quantized values for digital signal z[n] 104 dictates that, in some instances, values of analog signal x[n] 102 must be approximated. It is desirable to minimize quantization error e[n], which is an unwanted byproduct of the quantization process.

FIG. 3 illustrates the process within quantization functional component 204. The range of parameter variations of analog signal x[n] 102 is divided into a number of equal-sized subranges. The number of equal-sized subranges is defined by the value of MAX 112. If, for example, MAX 112 equals four, then the range of parameter variations of analog signal x[n] 102 is divided into four subranges, each measuring one-quarter of the range between LOW 108 and HIGH 110. A subrange "A" 302 extends from LOW 108 to a value at a point "Q1" 304. A subrange "B" 306 extends from Q1 304 to a value at a point "Q2" 308. A subrange "C" 310 extends from Q2 308 to a value at a point "Q3" 312. A subrange "D" 314 extends from Q3 312 to HIGH 110.

Both analog signal x[n] 102 and digital signal z[n] 104 are usually biased by specific values that can obscure the underlying relationship between the two signals. This relationship is more readily explained when analog signal x[n] 102 is understood to be centered at a point measuring one-half of the range between LOW 108 and HIGH 110. In the present example, this point is Q2 308. By translating the actual value of Q2 308 to zero and the remaining points in analog signal x[n] 102 accordingly, the bias value is removed from analog signal x[n] 102. Therefore, quantized values derived from this translated analog signal x[n] 102 correspond to digital signal z[n] 104 with its bias value removed.

To minimize quantization error e[n], a quantized value is located in each subrange at a point measuring one-half of the subrange. Each quantized value can be represented by a binary number. For example, a first quantized value "a" 316, represented by binary number zero, is located at the midpoint of subrange A 302. A second quantized value "b" 318, represented by binary number one, is located at the midpoint of subrange B 306. A third quantized value "c" 320, represented by binary number two, is located at the midpoint of subrange C 310. A fourth quantized value "d" 322, represented by binary number three, is located at the midpoint of subrange D 314.

The number of subranges determines the degree of resolution of ADC 106. Degree of resolution is typically expressed as the number of binary digits (i.e., bits) in the quantized values that can be produced by ADC 106. ADC 106 is characterized by its sampling frequency and its degree of resolution. The ability of ADC 106 to digitize analog signal x[n] 102 faithfully is a direct function of both of these. As the sampling frequency is increased, analog signal x[n] 102 is sampled at more points in time. As the degree of resolution is refined, the differences between digital signal z[n] 104 and analog signal x[n] 102 are minimized.

FIG. 4 is a graph 400 of bias-free values of digital signal z[n] 104 as a function of bias-free values of analog signal x[n] 102. A dashed line 402 represents the ideal direct relationship between the values of analog signal x[n] 102 and digital signal z[n] 104. The slope of dashed line 402 corresponds to the gain of ADC 106. A shaded portion 404 between graph 400 and dashed line 402 corresponds to quantization error e[n]. The same error pattern applies to each subrange. The measure of each subrange is referred to as the measure of a Least Significant Bit (LSB).

Statistical methods are often used to analyze quantization error e[n]. FIG. 5 is a graph 500 of a probability density "P(p)" 502 of a subrange of digital signal z[n] 104 as a function of the parameter "p" 504 of analog signal x[n] 102. Probability density P(p) 502 is centered at the midpoint of the subrange (i.e., at a 316, b 318, c 320, or d 322). Probability density P(p) 502 corresponds to quantization error e[n]. Probability density P(p) 502 shows that digital signal z[n] 104 has the same value throughout the subrange, where the subrange extends on either side of its midpoint for a measure equal to one-half of the LSB. The constant value of digital signal z[n] 104 within each subrange and its relationship to quantization error e[n] is also shown by graph 400.

Further analysis of quantization error e[n] is often performed in the frequency domain. FIG. 6 is a graph 600 of probability density P(p) 502 in the frequency domain. Graph 600 shows an "absolute value of p" 602 as a function of frequency "freq" 604. In the frequency domain, quantization error e[n] is recast as quantization noise n[n]. Quantization noise n[n] has a constant value for all frequencies. This is referred to as "white noise." The white noise of ADC 106 is directly proportional to the measure of the LSB and indirectly proportional to the square root of the sampling frequency. Thus, quantization noise n[n] (and, by transformation, quantization error e[n]) can be minimized by increasing sampling frequency or decreasing the measure of the LSB. The measure of the LSB can be reduced by increasing the number of subranges into which the range of analog signal x[n] 102 is divided (i.e., increasing the number of bits that can be produced by ADC 106).

Because ADCs find uses in a wide variety of applications, design of these circuits has evolved along many paths to yield several distinct architectures, including "flash," "pipelined," "successive approximation," and "delta sigma." These designs are well known to those skilled in the art and their functional components vary in some respects from those of exemplary ADC 106. Each architecture has its benefits and drawbacks. Paramount among these is a tradeoff between bandwidth and degree of resolution. FIG. 7 is a graph 700 that shows the tradeoff between bandwidth and degree of resolution for the various ADC architectures. Graph 700 comprises a "degree of resolution" axis 702 and a "bandwidth" axis 704. The relative positions of the different ADC architectures are plotted with respect to axes 702, 704: a "flash" region 706, a "pipelined" region 708, a "successive approximation" region 710, and a "delta sigma" region 712.

In the design of network technologies, data conversion has often presented itself as a bottleneck that impedes the rate at which information is transmitted. Traditionally, those ADC architectures that can support large bandwidths for rapid transfers of data have been favored for network applications. Because much of the circuitry of a delta sigma ADC architecture is analog, its bandwidth is limited by the processing speed of its analog circuits.

However, emerging applications, such as full-motion video and voice over Internet, require high resolution data conversion. Fortunately, improvements in the methods of fabricating integrated electronic circuits have increased not only the processing speed and number of devices, but also the variety of devices (such as linear capacitors) that can be fabricated on a given area of substrate material. Delta sigma ADCs have benefitted from these developments, which have facilitated the use of delta sigma ADCs in network applications.

FIG. 8 is a block diagram of a first-order, single-stage, single-bit delta sigma ADC 800. ADC 800 comprises a first-order, single-stage, single-bit delta sigma modulator 802 and a digital decimator 804 connected at a node "$N_O$" 806 along a signal path 808. Modulator 802 comprises a summing node "$\Sigma_O$" 810, an integrator 812, a single-bit quantizer 814, and a DAC 816. Summing node $\Sigma_O$ 810, integrator 812, and quantizer 814 are connected, respectively, in series along signal path 808. Integrator 812 has a gain "$a_1$". Gain $a_1$ is determined empirically and is set to a value such that modulator 802 functions with stability to process analog signal x[n] 102. Typically, gain $a_1$ has a value between zero and one. DAC 816 is connected in parallel with signal path 808 between node $N_O$ 806 and summing node $\Sigma_O$ 810. Decimator 804 comprises a lowpass digital filter 818 and a downsampler 820 connected, respectively, in series along signal path 808. Analog signal x[n] 102 is received by ADC 800, at an input 822, and converted into digital signal z[n] 104, produced at an output 824.

Initially, analog signal x[n] 102 passes through summing node $\Sigma_O$ 810 and is sampled by integrator 812. Integrator 812 integrates analog signal x[n] 102 over a given period of time to produce an integrated signal "v[n]" 826. Integrated signal v[n] 826 is transmitted to single-bit quantizer 814. Single-bit quantizer 814 rounds integrated signal v[n] 826 to the closest of two preset levels (i.e., a single bit) to produce a quantized signal "y[n]" 828. To minimize the difference between quantized signal y[n] 828 and analog signal x[n] 102, quantized signal y[n] 824 is transmitted to DAC 816 and converted to produce an analog feedback signal "fbk[n]" 830, which is fed back to summing node $\Sigma_O$ 810. Quantizer 814 and DAC 816 have a combined gain "$k_1$" defined as shown in Eq. (1):

$$k_1 = fbk[n]/v[n] \qquad \text{Eq.(1)}$$

where both analog feedback signal fbk[n] 830 and integrated signal v[n] 826 are analog signals.

At summing node $\Sigma_O$ 810, analog feedback signal fbk[n] 830 is subtracted from analog signal x[n] 102 to produce an analog difference signal "u[n]" 832. Analog difference signal u[n] 832 passes into integrator 812 to repeat the process described above. Essentially, integrator 812 integrates the difference between quantized signal y[n] 828 and analog signal x[n] 102. Over a large number of samples, integrator 812 forces this difference to approach zero. Thus, analog signal x[n] 102 is received by modulator 802, at input 822, and converted into quantized signal y[n] 828, produced at node $N_O$ 806. Input 822 is an input and node $N_O$ 806 is an output of modulator 802.

FIG. 9 is a graph 900 of bias-free values of quantized signal y[n] 828, produced by single-bit quantizer 814, as a function of bias-free values of analog signal x[n] 102. With analog signal x[n] 102 centered at a point measuring one-half of the range between LOW 108 and HIGH 110 (e.g., point Q2 308 from the example above), quantizer 814 divides analog signal x[n] 102 into two subranges. Quantizer 814 assigns a lower value "LOWER" 902 to those values of analog signal x[n] 102 that are less than the midpoint (e.g., Q2 308) value, and a higher value "HIGHER" 904 to those values of analog signal x[n] 102 that are greater than the midpoint (e.g., Q2 308) value. Typically, LOWER 902 is the lowest quantized value and HIGHER 904 is the highest quantized value that can be produced by quantizer 814.

Because single-bit quantizer 814 does not produce any quantized values that are in between LOWER 902 and HIGHER 904 (its lowest and highest quantized values), gain $k_1$ is essentially indeterminate. However, for analysis purposes, it is desirable to set an overall gain of modulator 802, the product of gain $a_1$ and gain $k_1$, equal to one.

Returning to FIG. 8, quantized signal y[n] 828 from modulator 802 comprises a stream of quantized values. Each quantized value is either LOWER 902 or HIGHER 904 (i.e., a single bit of resolution). Typically, this stream is produced at a modulator frequency that is several times greater than the carrier frequency of analog signal x[n] 102. The ratio of the modulator frequency to the Nyquist frequency is referred to as the oversampling ratio (OSR).

Decimator 804 acts to lowpass filter and downsample quantized signal y[n] 828. Quantized signal y[n] 828 is transmitted to lowpass digital filter 818, which performs a sophisticated form of averaging on the data stream to produce a high resolution signal "w[n]" 834. A maximum value "MAXIMUM" is defined by the number of different quantized values that can be produced by filter 818. High resolution signal w[n] 834 also comprises a stream of quantized values. However, each quantized value can be any of the different quantized values (i.e., multiple bits of resolution) that can be produced by filter 818.

High resolution signal w[n] 834 emerges from filter 818 at a frequency too high for subsequent digital signal processing. High resolution signal w[n] 834 is transmitted to downsampler 820, which resamples high resolution signal w[n] 834 to produce digital signal z[n] 104. Digital signal z[n] 104 enjoys the same high resolution as high resolution signal w[n] 834, but at a digital processing frequency. Typically, the digital processing frequency is greater than or equal to the Nyquist frequency. Thus, quantized signal y[n] 828 is received by decimator 804, at node $N_0$ 806, and converted into digital signal z[n] 104, produced at output 824. Node $N_0$ 806 is an input and output 824 is an output of decimator 804.

The usefulness of the high resolution of ADC 800 turns on its ability to minimize quantization noise n, which is an unwanted byproduct of the quantization process. Fortunately, it is a feature of modulator 802 that it acts as a highpass filter for quantization noise n, much of which can be removed by lowpass digital filter 818. This capability is more readily explained by analyzing modulator 802 in the discrete time domain.

FIG. 10 is a block diagram of first-order, single-stage, single-bit delta sigma modulator 802 recast as a discrete time domain model 1000. Model 1000 comprises a sampling and integration delay element 1002, summing node $\Sigma_0$ 810, a discrete time integrator 1004, a gain element 1006, a second summing node "$\Sigma_1$" 1008, and a feedback delay element 1010. Sampling and integration delay element 1002, summing node $\Sigma_0$ 810, discrete time integrator 1004, gain element 1006, second summing node $\Sigma_1$ 1008 are connected, respectively, in series along signal path 808. Sampling and integration delay element 1002 has a transfer function of "$z^{-1}$". Discrete time integrator 1004 has a transfer function of "$z^{-1}/(1-z^{-1})$" and gain $a_1$. Gain element 1006 has gain $k_1$. Feedback delay element 1010 is connected in parallel with signal path 808 between node $N_0$ 806 and summing node $\Sigma_0$ 810. Feedback delay element 1010 has transfer function $z^{-1}$.

In model 1000, quantization noise n[n] 1012 is added at second summing node $\Sigma_1$ 1008. Recalling that gain $a_1$ is set equal to the inverse of gain $k_1$, quantized signal y[n] 828 can be expressed as shown in Eq. (2):

$$y[n]=x[n]z^{-1}+n[n](1-z^{-1}) \qquad \text{Eq.(2)}$$

Eq. (2) shows how modulator 802 acts as a highpass filter for quantization noise n[n] 1012. This characteristic is also referred to as noise shaping.

The coupling of modulator 802 with lowpass digital filter 818 of decimator 804 enables ADC 800 to enjoy a relatively high signal-to-noise ratio (SNR) in comparison with other ADC architectures. As a "rule of thumb", the SNR for ADC 800 improves by 9 dB for every doubling of its OSR.

SNR is an important figure of merit for ADC performance. Improvements in the methods of fabricating integrated electronic circuits have reduced the size of electron devices. This has enabled ADC 800 to be designed to consume less power. However, reduced power consumption is often realized in part by using lower power supply voltages. Integrator 812 is implemented using an operational amplifier. Because some of the range between supply voltages to an operational amplifier must be consumed to support holding active load devices and current sources in saturation, only the remaining portion of this range is available for the output swing of the operational amplifier. This remaining portion is referred to as the dynamic range of the operational amplifier. So that ADC 800 does not suffer from nonidealities caused by the operational amplifier that implements integrator 812, it is important that the swing of integrated signal v[n] 826 remain within the dynamic range of the operational amplifier.

First order, single-stage, single-bit delta sigma modulator 802 is a basic design for a sigma delta modulator. Variations to this basic design have been introduced to improve various figures of merit.

FIG. 11 is a block diagram of a second-order, single-stage, single-bit delta sigma modulator 1100. Modulator 1100 comprises first summing node $\Sigma_0$ 810, first integrator 812, a second summing node "$\Sigma_2$" 1102, a second integrator 1104, single-bit quantizer 814, and DAC 816. First summing node $\Sigma_0$ 810, first integrator 812, second summing node $\Sigma_2$ 1102, second integrator 1104, and quantizer 814 are connected, respectively, in series along signal path 808. First integrator 812 has a gain of "$a_3$". Second integrator 1104 has a gain of "$a_4$". Gains $a_3$ and $a_4$ are determined empirically and are set to values such that modulator 1100 functions with stability to process analog signal x[n] 218. Typically, gains $a_3$ and $a_4$ have values between zero and one. DAC 816 is connected in parallel with signal path 808 between node $N_0$ 806 and summing nodes $\Sigma_0$ 810 and $\Sigma_2$ 1102. Quantizer 814 and DAC 816 have a combined gain $k_1$. For analysis purposes, $k_1=1/a_3a_4$. A higher order compensation gain element "$2a_3$" 1106 is connected between DAC 816 and second summing node $\Sigma_2$ 1102. Higher order compensation gain element $2a_3$ 1106 has a gain of "$2a_3$". Analog signal x[n] 218 is received by modulator 1100, at input 224, and converted into quantized signal y[n] 828, produced at node $N_0$ 806. Input 224 is an input and node $N_0$ 806 is an output of modulator 1100.

In a discrete time implementation (see FIG. 15A), second integrator 1104 acts as a second highpass filter for quantization noise n[n] 1012. Higher order compensation gain element $2a_3$ 1106 enables quantized signal y[n] 828 to be expressed strictly as a second order function as shown in Eq. (3):

$$y[n]=x[n]z^{-2}+n[n](1-z^{-1})^2. \qquad \text{Eq.(3)}$$

Thus, a delta sigma ADC that incorporates modulator 1100 can enjoy a better SNR than ADC 800. As a rule of thumb, the SNR for a delta sigma ADC that incorporates modulator 1100 improves by 15 dB for every doubling of its OSR. A similar analysis can be used to assess higher order delta sigma modulators. However, empirical studies have shown that, while delta sigma ADCs that incorporate higher order modulators are relatively insensitive to nonidealities in their functional components, the stability of these circuits rapidly deteriorates beyond the second order.

As mentioned above, exemplary ADC 106 comprises sampling functional component 202 and quantization functional component 204. Often sampling functional component 202 is realized as a switched capacitor sampling network. High performance switch capacitor sampling networks are typically configured as differential circuits. As compared with single-ended designs, a differential embodiment enjoys improved power supply noise rejection, double the output range, and cancellation of even-order distortion components.

FIG. 12A is a schematic diagram of a typical differential switched capacitor sampling network 1200 as could be used as an input circuit with modulator 802. Network 1200 comprises ten switches: "$S_1$" 1202, "$S_2$" 1204, "$S_3$" 1206, "$S_4$" 1208, "$S_5$" 1210, "$S_6$" 1212, "$S_7$" 1214, "$S_8$" 1216, "$S_9$" 1218, and "$S_{10}$" 1220. Collectively, $S_1$ 1202, $S_2$ 1204, $S_3$ 1206, $S_4$ 1208, $S_5$ 1210, and $S_6$ 1212 are referred to as signal conducting switches, while $S_7$ 1214, $S_8$ 1216, $S_9$ 1218, and $S_{10}$ 1220 are collectively referred to as summing junction switches.

FIG. 12B illustrates a two-phase nonoverlapping clock 1222 defined by four clock waveforms: "$\phi_1$" 1224, "$\phi_{1D}$" 1226, "$\phi_2$" 1228, and "$\phi_{2D}$" 1230. The position of each switch at any given time is determined by its corresponding clock waveform. In a representative embodiment, a switch is open when its corresponding clock waveform is "off" and closed when its corresponding clock waveform is "on." One skilled in the art would recognize that network 1200 could be configured with other relationships between the state of the switches and their corresponding clock waveforms.

Clock 1222 is configured so that $\phi_1$ 1224 and $\phi_{1D}$ 1226 are on when $\phi_2$ 1228 and $\phi_{2D}$ 1230 are off. Clock waveforms $\phi_{1D}$ 1224 and $\phi_{2D}$ 1226 are similar to, respectively, clock waveforms $\phi_1$ 1224 and $\phi_2$ 1228. However, the falling edges of $\phi_{1D}$ 1226 and $\phi_{2D}$ 1230 are not initiated until after $\phi_1$ 1224 and $\phi_2$ 1226 have returned to their "off" states. Together, clock waveforms $\phi_1$ 1224 and $\phi_{1D}$ 1226 define a sampling phase of clock 1222 while clock waveforms $\phi_2$ 1228 and $\phi_{2D}$ 1230 define a integration phase.

Network 1200 further comprises a positive voltage sampling capacitor "$C_1^+$" 1232, a negative voltage sampling capacitor "$C_1^-$" 1234, and integrator 812. Integrator 812 comprises an operational amplifier 1236 with an inverting terminal "$T^-$" 1238 and a noninverting terminal "$T^+$" 1240. $T^-$1238 and $T^+$1240 together comprise summing node $\Sigma_0$ 810. Integrator 812 produces integrated signal v[n] 826, which comprises a positive voltage output signal "$V_o^+$" 1242 and a negative voltage output signal "$V_o^-$" 1244. A positive voltage integrator feedback capacitor "$C_2^+$" 1246 is connected in parallel with operational amplifier 1236 between $T^-$ 1238 and $V_o^+$ 1242. A negative voltage integrator feedback capacitor "$C_2^-$" 1248 is connected in parallel with operational amplifier 1236 between $T^+$ 1240 and $V_o^-$ 1244. Analog signal x[n] 102, which comprises a positive voltage input signal "$V_i^+$" 1250 and a negative voltage input signal "$V_i^-$" 1252, is received by network 1200.

In a preferred embodiment, the value of $C_1^+$ 1232 equals the value of $C_1^-$ 1234, and the value of $C_2^+$ 1246 equals the value of $C_2^-$ 1248. For each of the positive and negative portions of network 1200, the sampling and integrator feedback capacitors determine the gain (e.g., $a_3$) of the corresponding integrator (e.g., first integrator 812) as shown in Eq. (4):

$$\text{Gain} = C_S/C_f \qquad \text{Eq.(4)}$$

where "$C_s$" is $C_1^+$ 1232 for the positive portion of network 1200 and $C_1^-$ 1234 for the negative portion of network 1200, and "$C_f$" is $C_2^+$ 1246 for the positive portion of network 1200 and $C_2^-$ 1248 for the negative portion of network 1200.

For each of the positive and negative portions of network 1200, the sampling and integrator feedback capacitors also determine a feedback factor as shown in Eq. (5):

$$\text{Feedback Factor} = C_f/[C_f + C_s]. \qquad \text{Eq.(5)}$$

The feedback factor directly affects the bandwidth of the operational amplifier used to implement integrator 812. A larger bandwidth corresponds to a faster response (or settling) time of the operational amplifier. Settling time is proportional to the product of the feedback factor and the power consumed by the operational amplifier used to implement integrator 812.

In network 1200, switch $S_1$ 1202 is disposed between a negative reference signal "ref$^-$" 1254 and $C_1^+$ 1232. Switch $S_2$ 1204 is disposed between a positive reference signal "ref$^+$" 1256 and $C_1^+$ 1232. Switch $S_3$ 1206 is disposed between $V_i^+$ 1250 and $C_1^+$ 1232. Thus, switches $S_1$ 1202, $S_2$ 1204, and $S_3$ 1206 are connected in parallel with each other at a node "$N_1$" 1258 upstream of $C_1^+$ 1232. Likewise, switch $S_4$ 1208 is disposed between ref$^+$ 1256 and $C_1^-$ 1234. Switch $S_5$ 1210 is disposed between ref 1254 and $C_1^-$ 1234. Switch $S_6$ 1212 is disposed between $V_i^-$ 1252 and $C_1^-$ 1234. Thus, switches $S_4$ 1208, $S_5$ 1210, and $S_6$ 1212 are connected in parallel with each other at a node "$N_2$" 1260 upstream of $C_1^-$ 1234.

Switch $S_7$ 1214 is disposed between anode "$N_3$" 1262 downstream of $C_1^+$ 1232 and $T^-$ 1238. Switch $S_8$ 1216 is disposed between node $N_3$ 1262 and a network common mode voltage "$V_{CM}$" 1264. Likewise, switch $S_9$ 1218 is disposed between a node "$N_4$" 1266 downstream of $C_1^-$ 1234 and $T^+$ 1240. Switch $S_{10}$ 1220 is disposed between node $N_4$ 1266 and $V_{CM}$ 1264.

Operation of network 1200 can be explained by tracing the circuits that are established in response to the cycling of the clock waveforms of clock 1222.

At a time "$t_0$", clock waveforms $\phi_1$ 1224 and $\phi_{1D}$ 1226 cycle to the on state while clock waveforms $\phi_2$ 1228 and $\phi_{2D}$ 1230 remain in the off state. In response to the on state of $\phi_1$ 1224, switches $S_8$ 1216 and $S_{10}$ 1220 close. In response to the on state of $\phi_{1D}$ 1226, switches $S_3$ 1206 and $S_6$ 1212 close. With $S_3$ 1206 and $S_8$ 1216 closed, a circuit is established between $V_i^+$ 1250 and $V_{CM}$ 1264 through $C_1^+$ 1232. This circuit allows $V_i^+$ 1250 to be sampled as a charge on $C_1^+$ 1232. Likewise, with $S_6$ 1212 and $S_{10}$ 1220 closed, a circuit is established between $V_i^-$ 1252 and $V_{CM}$ 1264 through $C_1^-$ 1234. This circuit allows $V_i^-$ 1252 to be sampled as a charge on $C_1^-$ 1234.

At a time "$t_1$", clock waveform $\phi_1$ 1224 cycles to the off state, while $\phi_{1D}$ 1226 remains in the on state. Clock waveforms $\phi_2$ 1228 and $\phi_{2D}$ 1230 remain in the off state. In response to the off state of $\phi_1$ 1224, switches $S_8$ 1216 and $S_{10}$ 1220 open. Opening switch $S_8$ 1216 breaks the circuit between $V_i^+$ 1250 and $V_{CM}$ 1264. This isolates the charge stored on $C_1^+$ 1232, thus effectively sampling $V_i^+$ 1250. Likewise, opening switch $S_{10}$ 1220 breaks the circuit between $V_i^-$ 1252 and $V_{CM}$ 1264. This isolates the charge stored on $C_1^-$ 1234, thus effectively sampling $V_i^-$ 1252.

At a time "$t_2$", clock waveform ($\phi_{1D}$ 1226 cycles to the off state. Clock waveforms $\phi_1$ 1224, $\phi_2$ 1228, and $\phi_{2D}$ 1230 remain in the off state. In response to the off state of $\phi_{1D}$ 1226, switches $S_3$ 1206 and $S_6$ 1212 open. By delaying the opening of switches $S_3$ 1206 and $S_6$ 1212 until after switches $S_8$ 1216 and $S_{10}$ 1220 have been opened, and thus isolating the charges stored on $C_1^+$ 1232 and $C_1^-$ 1234, the sampled signals are unaffected by the charge injections that occur after switches $S_8$ 1216 and $S_{10}$ 1220 have been opened. Particularly, the sampled signals are not distorted by any charge injection resulting from the opening of switches $S_3$ 1206 and $S_6$ 1212.

At a time "$t_3$", clock waveforms ($\phi_2$ 1228 and $\phi_{2D}$ 1230 cycle to the on state while clock waveforms $\phi_1$ 1224 and $\phi_{1D}$ 1226 remain in the off state. In response to the on state of $\phi_2$ 1228, switches $S_7$ 1214 and $S_9$ 1218 close. In response to the on state of $\phi_{2D}$ 1230, either switch $S_1$ 1202 or $S_2$ 1204 and either switch $S_4$ 1208 or $S_5$ 1210 close. (In a delta sigma modulator, the polarity of the data in the feedback loop determines which one of switches $S_1$ 1202 and $S_2$ 1204 and which one of switches $S_4$ 1208 and $S_5$ 1210 close.)

With switches $S_7$ 1214 and $S_1$ 1202 closed, a circuit is established between ref⁻ 1254 and inverting terminal T⁻ 1238 through $C_1^+$ 1232. This circuit enables the charge on $C_1^+$ 1232 to be transferred to $C_2^+$ 1246. The transferred charge "Q⁺" at inverting terminal T⁻ 1238 is defined by Eq. (6):

$$Q^+ = C_1^+(V_i^+ - ref^-).  \quad\quad\quad\text{Eq.(6)}$$

Similarly, with switches $S_9$ 1218 and $S_4$ 1208 closed, a circuit is established between ref⁺ 1256 and noninverting terminal T⁺ 1240 through $C_1^-$ 1234. This circuit enables the charge on $C_1^-$ 1234 to be transferred to $C_2^-$ 1248. The transferred charge "Q⁻" at noninverting terminal T⁺ 1240 is defined by Eq. (7):

$$Q^- = C_1^-(V_i^- - ref^+).  \quad\quad\quad\text{Eq.(7)}$$

Alternatively, with switches $S_7$ 1214 and $S_2$ 1204 closed, a circuit is established between ref⁺ 1256 and inverting terminal T⁻ 1238 through $C_1^+$ 1232. This circuit enables the charge on $C_1^+$ 1232 to be transferred to $C_2^+$ 1246. The transferred charge Q⁺ at inverting terminal T⁻ 1238 is defined by Eq. (8):

$$Q^+ = C_1^+(V_i^+ - ref^+).  \quad\quad\quad\text{Eq.(8)}$$

Similarly, with switches $S_9$ 1218 and $S_5$ 1210 closed, a circuit is established between ref⁻ 1254 and noninverting terminal T⁺ 1240 through $C_1^-$ 1234. This circuit enables the charge on $C_1^-$ 1234 to be transferred to $C_2^-$ 1248. The transferred charge Q⁻ at noninverting terminal T⁺ 1240 is defined by Eq. (9):

$$Q^- = C_1^-(V_i^- - ref^-).  \quad\quad\quad\text{Eq.(9)}$$

At a time "$t_4$", clock waveform $\phi_2$ 1228 cycles to the off state, while $\phi_{2D}$ 1230 remains in the on state. Clock waveforms $\phi_1$ 1224 and $\phi_2$ 1228 remain in the off state. In response to the off state of $\phi_2$ 1228, switches $S_7$ 1214 and $S_9$ 1218 open. Opening switch $S_7$ 1214 breaks the circuit between inverting terminal T⁻ 1238 and either ref 1254 or ref⁺ 1256. This isolates the charge transferred to $C_2^+$ 1246. Likewise, opening switch $S_9$ 1218 breaks the circuit between noninverting terminal T⁺ 1240 and either ref⁺ 1256 or ref 1254. This isolates the charge transferred to $C_2^-$ 1248.

At a time "$t_5$", clock waveform $\phi_{2D}$ 1230 cycles to the off state. Clock waveforms $\phi_1$ 1224, $\phi_{1D}$ 1226, and $\phi_2$ 1228 remain in the off state. In response to the off state of $\phi_{2D}$ 1230, either switch $S_1$ 1202 or $S_2$ 1204 and either switch $S_4$ 1208 or $S_5$ 1210 open. By delaying the opening of either switch $S_1$ 1202 or $S_2$ 1204 and either switch $S_4$ 1208 or $S_5$ 1210 until after switches $S_7$ 1214 and $S_9$ 1218 have been opened, the transferred signals are unaffected by the charge injection that occur after switches $S_7$ 1214 and $S_9$ 1218 have been opened. Particularly, the transferred signals are not distorted by any charge injection resulting from the opening of either switch $S_1$ 1202 or $S_2$ 1204 and either switch $S_4$ 1208 or $S_5$ 1210.

At a time "$t_6$", clock waveforms $\phi_1$ 1224 and $\phi_{1D}$ 1226 cycle to the on state while clock waveforms $\phi_2$ 1228 and $\phi_{2D}$ 1230 remain in the off state. The response of network 1200 to the on state of $\phi_1$ 1224 and $\phi_{1D}$ 1226 is identical to the response to the on state at time $t_0$ as explained above. Likewise, at times subsequent to $t_6$, network 1200 operates in the manner explained above. Thus, the time between $t_0$ and $t_6$ defines the period of clock 1222.

In a more typical embodiment, the switches of FIG. 12A are implemented with metal oxide semiconductor field effect transistors (MOSFETs). FIG. 13 is a schematic diagram of a differential switched capacitor sampling network 1300 implemented with MOSFET switches. This circuit is described in Stephen R. Norsworthy et al., *Delta-Sigma Data Converters: Theory, Design, and Simulation*, The Institute of Electrical and Electronics Engineers, Inc. 1997, which is incorporated herein by reference. Although network 1300 is configured different from network 1200, the principles for implementing switches with MOSFETs are the same for both networks 1200 and 1300. For each MOSFET switch of FIG. 13, the signal path is between its source and drain terminals. The state of the MOSFET switch is controlled by a clock waveform applied to its gate terminal. Typically, the clock waveform has a voltage equal to one of the supply voltages.

Where a switch in a differential switched capacitor sampling network is implemented as a MOSFET, the resistance "R" of the switch is defined by Eq. (10):

$$R = 1/[kW/L(V_{GS} - V_T - V_{DS})],  \quad\quad\quad\text{Eq.(10)}$$

where "k" is a constant, "W" is the width of the channel region of the MOSFET, "L" is the length of the channel region of the MOSFET, "$V_{GS}$" is the voltage potential between the gate and source terminals, "$V_T$" is the threshold voltage, and "$V_{DS}$" is the voltage potential between the drain and source terminals of the MOSFET. These parameters are well understood in the art.

While delaying the opening of the signal conducting switches (e.g., $S_1$ 1202, $S_2$ 1204, $S_3$ 1206, $S_4$ 1208, $S_5$ 1210, and $S_6$ 1212) until after the summing junction switches (e.g., $S_7$ 1214, $S_8$ 1216, $S_9$ 1218, and $S_{10}$ 1220) have been opened isolates the sampled signal from distortions due to charge injections from the signal conducting switches, clock 1222 does not protect the sampled signal from distortions due to charge injections from the summing junction switches.

Furthermore, clock 1222 causes charge injections from the signal conducting switches (e.g., $S_1$ 1202, $S_2$ 1204, $S_3$ 1206, $S_4$ 1208, $S_5$ 1210, and $S_6$ 1212) into ref⁻ 1254 and ref⁺ 1256. Typically, ref⁻ 1254 and ref⁺ 1256 are produced by constant voltage buffers. In order for a modulator using network 1200 to attain a desired degree of linear performance, the circuits that produce ref⁻ 1254 and ref⁺ 1256 must be designed to meet certain settling requirements. Charge injections into ref⁻ 1254 and ref⁺ 1256 can complicate these designs such that the circuits that produce ref⁻ 1254 and ref⁺ 1256 consume significant power.

As mentioned above, integrator 812 comprises operational amplifier 1236. It can be shown that the common mode input signal "$V_{ic}$" of operational amplifier 1236 can be expressed as shown in Eq. (11):

$$V_{ic} = [(V_i^+ + V_i^-)/2 - (ref^+ + ref^-)/2 + V_{CM}].  \quad\quad\quad\text{Eq.(11)}$$

In traditional implementations, $(V_i^+ + V_i^-)/2$, $(ref^+ + ref^-)/2$, and $V_{CM}$, are maintained at values midway between the two supply voltages to facilitate maximum signal swing. Unfortunately, where the summing junction switches (e.g., $S_7$ 1214, $S_8$ 1216, $S_9$ 1218, and $S_{10}$ 1220) are implemented as MOSFETs, maintaining $(V_i^+ + V_i^-)/2$, $(ref^+ + ref^-)/2$, and $V_{CM}$ at values midway between the two supply voltages causes $V_{GS}$ of these switches to have relatively small values.

By application of Eq. (10), this causes the summing junction switches to have relatively large resistances, which typically are associated with relatively large switches. Large switches can cause correspondingly large charge injections.

What is needed is a mechanism that reduces distortions due to charge injections. Preferably, such a mechanism should also reduce the power consumed by a delta sigma modulator.

BRIEF SUMMARY OF THE INVENTION

In a high order delta sigma modulator stage having integrators with pipelined cross coupled input circuits, the processing delay between an upstream integrator and a downstream integrator is decreased from a full cycle of a clock used to control the high order delta sigma modulator stage to a half cycle of the clock, while the processing delay between a quantizer and a portion of a digital-to-analog converter that provides feedback to the upstream integrator is increased by a half cycle of the clock. This configuration: (1) eliminates poles from the transfer function that defines processing of a signal by the high order delta sigma modulator stage, (2) reduces the power consumed by the high order delta sigma modulator stage for a given settling time requirement, (3) facilitates reducing the size of the summing junction switches in the high order delta sigma modulator stage to decrease distortions due to charge injections, and (4) allows a reference signal voltage, which is coupled to a cross coupled feedback switched capacitor network in the integrators, to be set equal to one of two power supply voltages for the high order delta sigma modulator stage, thereby further reducing the power consumed by the delta sigma modulator.

In an embodiment, the present invention comprises a delta sigma modulator having a first integrator, a second integrator, a quantizer, and a half period delay buffer. The first integrator has a first cross coupled switched capacitor sampling network with an input capable of receiving an analog signal. The second integrator is coupled to the first integrator and has a second cross coupled switched capacitor sampling network. Preferably, the first and the second cross coupled switched capacitor sampling networks are configured as differential circuits. The first and the second cross coupled switched capacitor networks can include a reference voltage that is less than an average of two power supply voltages for the delta sigma modulator. The quantizer is coupled to the second integrator and has a first output capable of producing a modulated signal. The half period delay buffer is coupled between the quantizer and the first integrator. The first integrator samples during a first phase of a clock and both samples and integrates during a second phase of the clock and the second integrator both samples and integrates during the first phase of the clock and samples during the second phase of the clock. Typically, during the first phase of the clock, a set of switches in the first cross coupled switched capacitor sampling network is closed while contemporaneously a corresponding set of switches in the second cross coupled switched capacitor sampling network is opened.

In an embodiment, the first and the second cross coupled switched capacitor sampling networks each include a sampling capacitor, a first summing junction switch, an operational amplifier, and a second summing junction switch. The sampling capacitor has a first terminal and a second terminal. The first terminal is coupled to an input of a corresponding cross coupled switched capacitor sampling network. The first summing junction switch has a third terminal and a fourth terminal. The third terminal is coupled to the second terminal. The operational amplifier has a fifth terminal coupled to the fourth terminal. The second summing junction switch has a sixth terminal and a seventh terminal. The sixth terminal is coupled to the second terminal of the sampling capacitor. The seventh terminal is coupled to a reference voltage. The reference voltage is less than an average of two power supply voltages for the delta sigma modulator. Preferably, the first and the second summing junction switches are metal oxide semiconductor field effect transistors (MOSFETs). For a given resistance of the second summing junction MOSFET switch, a size of the second summing junction MOSFET switch is a function of the reference voltage.

The first cross coupled switched capacitor sampling network can include a digital-to-analog converter. Preferably, the digital-to-analog converter is configured as a cross coupled feedback switched capacitor network. The cross coupled feedback switched capacitor network can be coupled to a reference signal voltage. The reference signal voltage can be equal to one of two power supply voltages for the delta sigma modulator. The half period delay buffer can have a second output capable of producing a delayed modulated signal, and a third output capable of producing an inverse delayed modulated signal. The switches in the cross coupled feedback switched capacitor network can be further controlled by the delayed modulated signal and the inverse delayed modulated signal.

The second cross coupled switched capacitor sampling network includes a digital-to-analog converter. Preferably, the digital-to-analog converter is configured as a cross coupled feedback switched capacitor network. The cross coupled feedback switched capacitor network can be coupled to a reference signal voltage. The reference signal voltage can be equal to one of two power supply voltages for the delta sigma modulator. The quantizer can have a second output capable of producing an inverse modulated signal. The switches in the cross coupled feedback switched capacitor network can be further controlled by the modulated signal and the inverse modulated signal.

In another embodiment, the present invention comprises a delta sigma modulator having a first integrator, a second integrator, and a quantizer. The first integrator has a first cross coupled switched capacitor sampling network with an input capable of receiving an analog signal. The second integrator is coupled to the first integrator and has a second cross coupled switched capacitor sampling network. The quantizer is coupled to the second integrator and has an output capable of producing a modulated signal. Preferably, a first processing delay between the first and the second integrators is half of a cycle of a clock, and a second processing delay between the first integrator and the quantizer is one-and-a-half of the cycle of the clock.

In yet another embodiment, the present invention comprises a delta sigma modulator having a first integrator, a second integrator, a quantizer, and a half period delay buffer. The first integrator has a first cross coupled switched capacitor sampling network with an input capable of receiving an analog signal. The second integrator is coupled to the first integrator. The quantizer is coupled to the second integrator and has an output capable of producing a modulated signal. The half period delay buffer is coupled between the quantizer and the first integrator.

In still another embodiment, the present invention comprises a delta sigma modulator having a first integrator, a second integrator, and a quantizer. The first integrator has an input capable of receiving an analog signal. The second integrator is coupled to the first integrator. The quantizer is coupled to the second integrator and has an output capable of producing a modulated signal. The first integrator samples during a first phase of a clock and both samples and integrates during a second phase of the clock and the second integrator both samples and integrates during the first phase of the clock and samples during the second phase of the clock.

The present invention also comprises a method of reducing distortions due to charge injections in a high order delta sigma modulator stage with cross coupled input circuits. A first integrator of the integrators is caused to sample during a first phase of a clock and to sample and integrate during a second phase of the clock. A second integrator of the integrators is caused to sample and integrate during the first phase and to sample and during the second phase. A reference voltage, which is coupled to a transistor summing junction switch in the integrators, is set less than an average of two power supply voltages for the high order delta sigma modulator stage.

The present invention also comprises a method of reducing power consumed in a high order delta sigma modulator stage with cross coupled input circuits. A first integrator of the integrators is caused to sample during a first phase of a clock and to sample and integrate during a second phase of the clock. A second integrator of the integrators is caused to sample and integrate during the first phase and to sample and during the second phase. A reference signal voltage, which is coupled to a cross coupled feedback switched capacitor network of the integrators, is set equal to one of two power supply voltages for the high order delta sigma modulator stage.

The present invention also comprises a method of eliminating poles from a noise transfer function of a high order delta sigma modulator stage with cross coupled input circuits. A first processing delay between an upstream integrator of the integrators and a downstream integrator of the integrators is reduced from a full cycle of a clock to a half cycle of the clock. A second processing delay between a quantizer of the high order delta sigma modulator stage and a portion of a digital-to-analog converter of the high order delta sigma modulator stage that provides feedback to the upstream integrator is increased by the half cycle of the clock.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 4 is a graph 400 of bias-free values of digital signal z[n] 104 as a function of bias-free values of analog signal x[n] 102.

FIG. 5 is a graph 500 of a probability density "P(p)" 502 of a subrange of digital signal z[n] 104 as a function of the parameter "p" 504 of analog signal x[n] 102.

FIG. 6 is a graph 600 of probability density P(p) 502 in the frequency domain.

FIG. 7 is a graph 700 that shows the tradeoff between bandwidth and degree of resolution for the various ADC architectures.

FIG. 8 is a block diagram of a first-order, single-stage, single-bit delta sigma ADC 800.

FIG. 9 is a graph 900 of bias-free values of quantized signal y[n] 828, produced by single-bit quantizer 814, as a function of bias-free values of analog signal x[n] 102.

FIG. 10 is a block diagram of first-order, single-stage, single-bit delta sigma modulator 802 recast as a discrete time domain model 1000.

FIG. 11 is a block diagram of a second-order, single-stage, single-bit delta sigma modulator 1100.

FIG. 12A is a schematic diagram of a typical differential switched capacitor sampling network 1200 as could be used with modulator 802.

FIG. 13 is a schematic diagram of a differential switched capacitor sampling network 1300 implemented with MOSFET switches.

FIG. 17 is a flow chart of a method 1700 of reducing distortions due to charge injections in a high order delta sigma modulator stage having integrators with cross coupled input circuits.

The preferred embodiments of the invention are described with reference to the figures where like reference numbers indicate identical or functionally similar elements. Also in the figures, the left-most digit(s) of each reference number identify the figure in which the reference number is first used.

DETAILED DESCRIPTION OF THE INVENTION

The present invention relates to a low power, high signal-to-noise ratio (SNR), high order delta sigma modulator stage having integrators with pipelined cross coupled input circuits. A first order, single stage delta sigma modulator with a cross coupled input circuit is taught by D. Kasha et al, "A 16 mW, 120 dB Linear Switched Capacitor Delta-Sigma Modulator With Dynamic Biasing," *IEEE Journal of Solid State Circuits* 34: 921–926 (July 1999), which is incorporated herein by reference. However, incorporating additional cross coupled input circuits into a high order, single stage delta sigma modulator can diminish the quality of the noise shaping characteristic of the modulator, which can reduce its SNR. The present invention overcomes the obstacles presented by incorporating additional cross coupled input circuits into a high order, single stage delta sigma modulator by decreasing the processing delay between an upstream integrator and a downstream integrator and by increasing the processing delay between a quantizer and a portion of a digital-to-analog converter that provides feedback to the upstream integrator.

Figure 1:
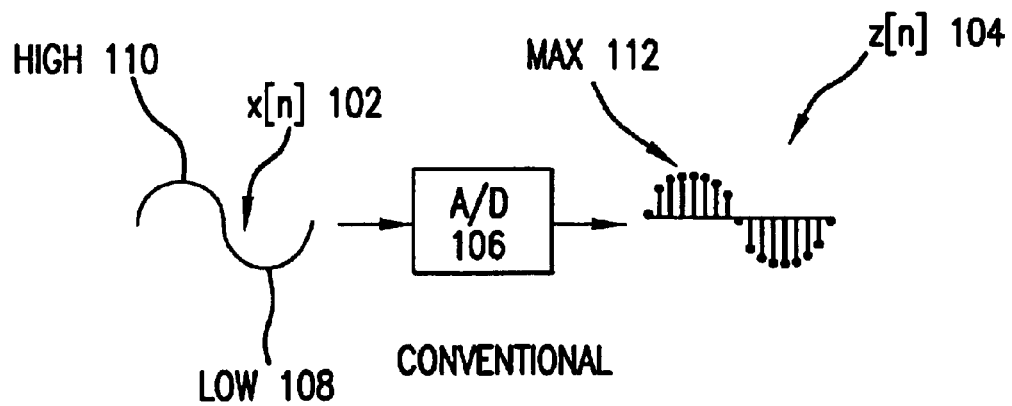
FIG. 1 shows a process for converting an analog signal "x[n]" 102 to a digital signal "z[n]" 104 using an exemplary ADC 106.
Figure 2:
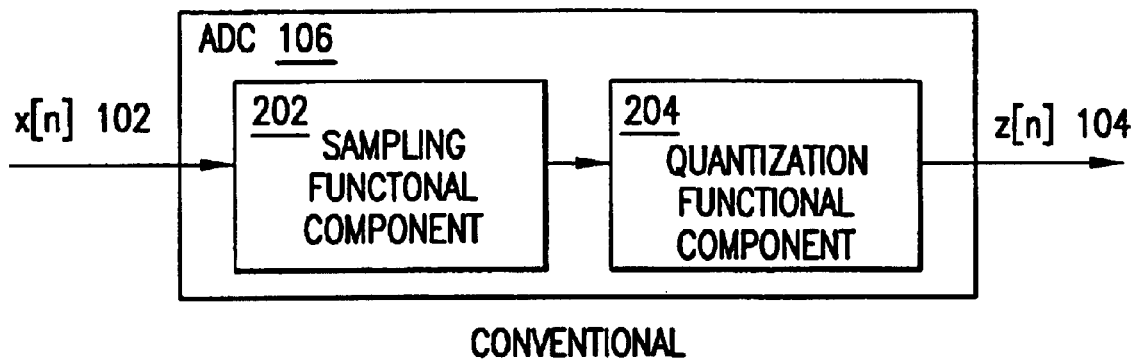
FIG. 2 is a block diagram of ADC 106. ADC 106 comprises a sampling functional component 202 and a quantization functional component 204.
Figure 3:
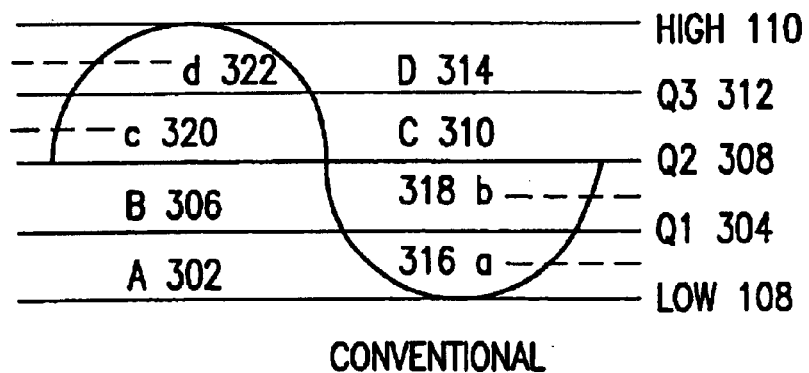
FIG. 3 illustrates the process within quantization functional component 204.
Figure 12B:
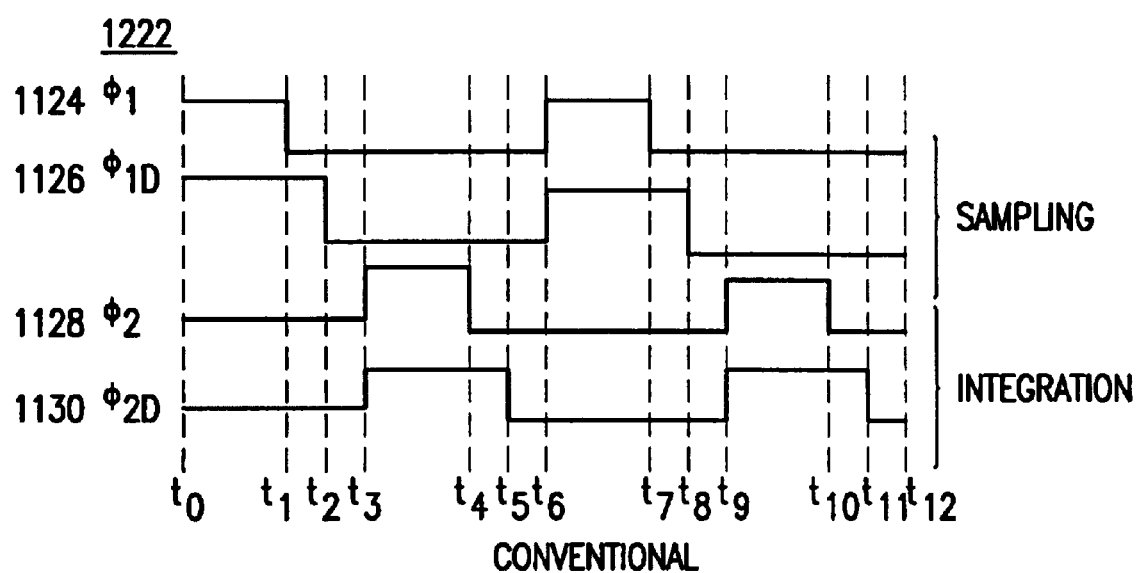
FIG. 12B illustrates a two-phase nonoverlapping clock 1222 defined by four clock waveforms: "$\phi_1$" 1224, "$\phi_{1D}$" 1226, "$\phi_2$" 1228, and "$\phi_{2D}$" 1230.
Figure 14A:
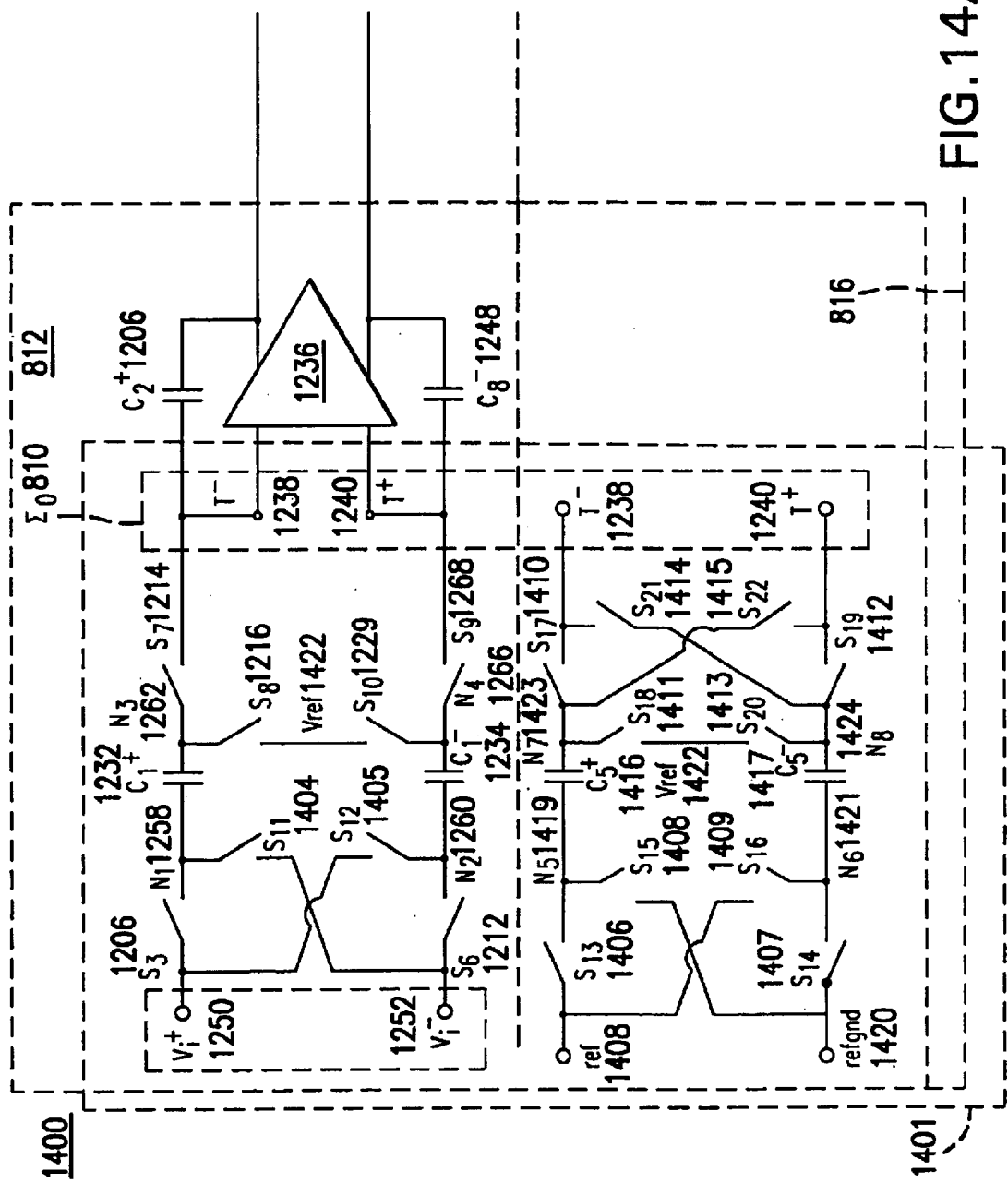
FIG. 14 is a schematic diagram of a second-order, single-stage, single-bit delta sigma modulator 1400 with cross coupled switched capacitor sampling networks 1401 and 1402 in the manner of the present invention.
Figure 14B:
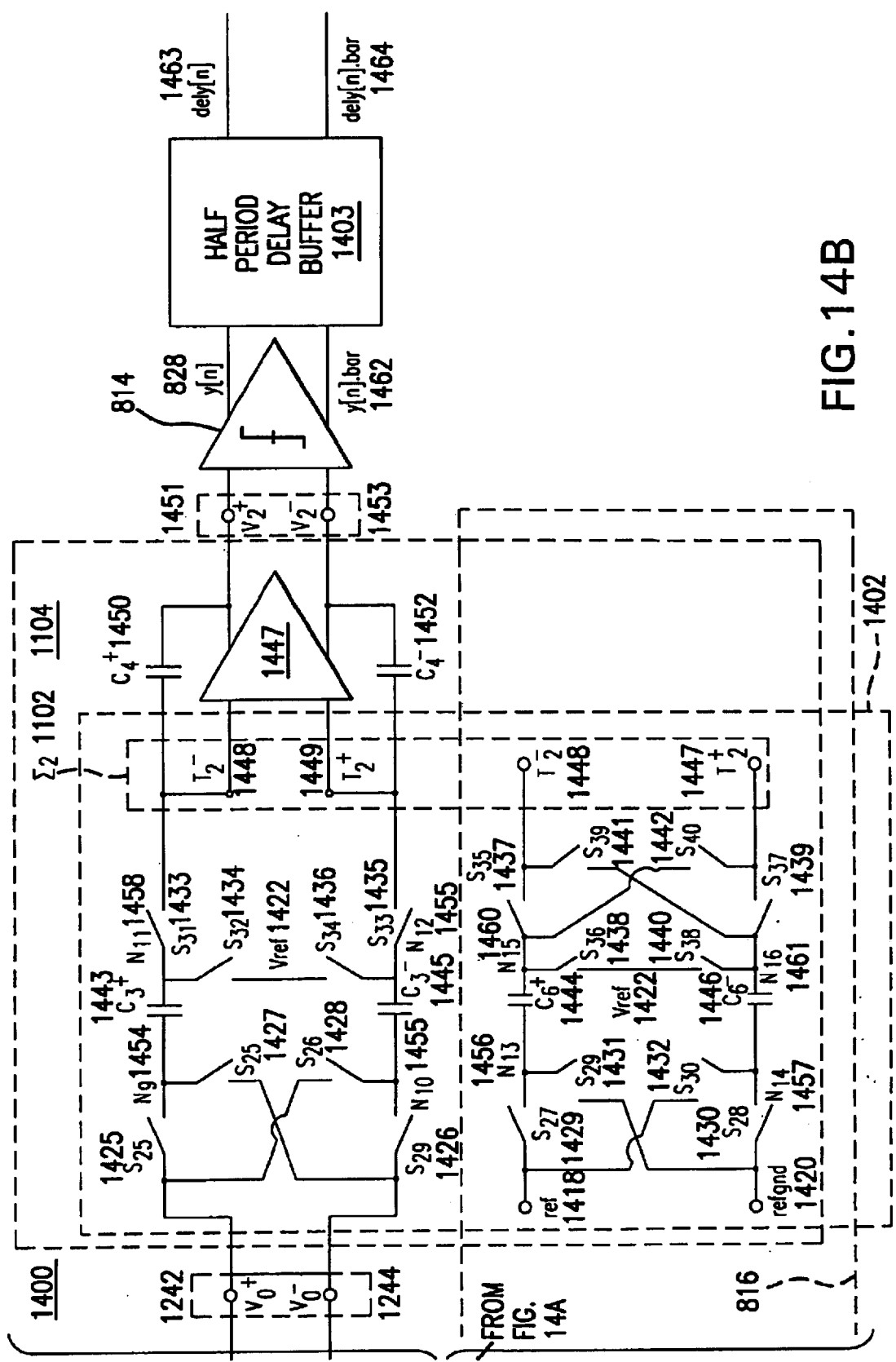

FIG. 14 is a schematic diagram of a second-order, single-stage, single-bit delta sigma modulator 1400 with cross coupled switched capacitor sampling networks 1401 and 1402 in the manner of the present invention. Modulator 1400 comprises first summing node $\Sigma_0$ 810, first (i.e., upstream) integrator 812, second summing node $\Sigma_2$ 1102, second (i.e., downstream) integrator 1104, single-bit quantizer 814, DAC 816, higher order compensation gain element $2a_3$ 1106 (which is proportional to the ratio of $C_6$ to $C_4$), and a half period delay buffer 1403. Modulator 1400 is configured in the same manner as modulator 1100 except that half period delay buffer 1403 is connected between $N_0$ 806 (not shown) and the portion of DAC 816 that provides feedback to upstream integrator 812 at first summing node $\Sigma_0$ 810.

Upstream cross coupled switched capacitor sampling network 1401 comprises eighteen switches: $S_3$ 1206, $S_6$ 1212, $S_7$ 1214, $S_8$ 1216, $S_9$ 1218, $S_{10}$ 1220, "$S_{11}$" 1404, "$S_{12}$" 1405, "$S_{13}$" 1406, "$S_{14}$" 1407, "$S_{15}$" 1408, "$S_{16}$" 1409, "$S_{17}$" 1410, "$S_{18}$" 1411, "$S_{19}$" 1412, "$S_{20}$" 1413, "$S_{21}$" 1414, and "$S_{22}$" 1415. Network 1401 further comprises first positive voltage sampling capacitor $C_1^+$ 1232, a second positive voltage sampling capacitor "$C_5^+$" 1416, negative voltage sampling capacitor $C_1^-$ 1234, and a second negative voltage sampling capacitor "$C_5^-$" 1417.

Collectively, $S_3$ 1206, $S_4$ 1208, $S_5$ 1210, $S_6$ 1212, $S_{11}$ 1404, $S_{12}$ 1405, $S_{13}$ 1406, $S_{14}$ 1407, $S_{15}$ 1408, and $S_{16}$ 1409 are referred to as signal conducting switches, while $S_7$ 1214, $S_8$ 1216, $S_9$ 1218, $S_{10}$ 1220, $S_{17}$ 1410, $S_{18}$ 1411, $S_{19}$ 1412, $S_{20}$ 1413, $S_{21}$ 1414, and $S_{22}$ 1415 are collectively referred to as summing junction switches.

Upstream integrator 812 comprises operational amplifier 1236 with inverting terminal $T^-$ 1238 and noninverting terminal $T^+$ 1240, positive voltage integrator feedback capacitor $C_2^+$ 1246, and negative voltage integrator feedback capacitor $C_2^-$ 1248. $T^-$ 1238 and $T^+$ 1240 together comprise first summing node $\Sigma_0$ 810. Positive voltage integrator feedback capacitor $C_2^+$ 1246 is connected in parallel with operational amplifier 1236 between $T^-$ 1238 and $V_o^+$ 1242. Negative voltage integrator feedback capacitor $C_2^-$ 1248 is connected in parallel with operational amplifier 1236 between $T^+$ 1240 and $V_o^-$ 1244.

Switch $S_3$ 1206 is disposed between $V_i^+$ 1250 and node $N_1$ 1258, and switch $S_6$ 1212 is disposed between $V_i^-$ 1252 and node $N_2$ 1260. Likewise, switch $S_{11}$ 1408 is disposed between $V_i^-$ 1252 and node $N_1$ 1258, and switch $S_{12}$ 1410 is disposed between $V_i^+$ 1250 and node $N_2$ 1260.

Similarly, switch $S_{13}$ 1406 is disposed between a reference signal "ref" 1418 and a node "$N_5$" 1419 upstream of $C_5^+$ 1416, and switch $S_{14}$ 1407 is disposed between a reference ground signal "refgnd" 1420 and a node "$N_6$" 1421 upstream of $C_5^-$ 1417. Likewise, switch $S_{15}$ 1416 is disposed between refgnd 1420 and node $N_5$ 1419, and switch $S_{16}$ 1409 is disposed between ref 1418 and node $N_6$ 1421.

Switch $S_7$ 1214 is disposed between node $N_3$ 1262 and $T^-$ 1238, and switch $S_8$ 1216 is disposed between node $N_3$ 1262 and a special reference voltage "$V_{ref}$" 1422. Likewise, switch $S_9$ 1218 is disposed between node $N_4$ 1266 and $T^+$ 1240, and switch $S_{10}$ 1220 is disposed between node $N_4$ 1266 and $V_{ref}$ 1422.

Similarly, switch $S_{17}$ 1410 is disposed between a node "$N_7$" 1423 downstream of $C_5^+$ 1416 and $T^-$ 1238, and switch $S_{18}$ 1411 is disposed between node $N_7$ 1423 and $V_{ref}$ 1422. Likewise, switch $S_{19}$ 1412 is disposed between a node "$N_8$" 1424 downstream of $C_5^-$ 1417 and $T^+$ 1240, and switch $S_{20}$ 1413 is disposed between node $N_8$ 1424 and $V_{ref}$ 1422. However, additionally switch $S_{21}$ 1414 is disposed between node $N_8$ 1424 and $T^-$ 1238, and switch $S_{22}$ 1415 is disposed between node $N_7$ 1423 and $T^+$ 1240.

In a preferred embodiment, the value of $C_1^+$ 1232 equals the value of $C_1^-$ 1234, the value of $C_2^+$ 1246 equals the value of $C_2^-$ 1248, and the value of $C_5^+$ 1416 equals the value of $C_5^-$ 1417.

Similarly, downstream cross coupled switched capacitor sampling network 1402 comprises eighteen switches: "$S_{23}$" 1425, "$S_{24}$" 1426, "$S_{25}$" 1427, "$S_{26}$" 1428, "$S_{27}$" 1429, "$S_{28}$" 1430, "$S_{29}$" 1431, "$S_{30}$" 1432, "$S_{31}$" 1433, "$S_{32}$" 1434, "$S_{33}$" 1435, "$S_{34}$" 1436, "$S_{35}$" 1437, "$S_{36}$" 1438, "$S_{37}$" 1439, "$S_{38}$" 1440, "$S_{39}$" 1441, and "$S_{40}$" 1442. Network 1402 further comprises a third positive voltage sampling capacitor "$C_3^+$" 1443, a fourth positive voltage sampling capacitor "$C_6^+$" 1444, a third negative voltage sampling capacitor "$C_3^-$" 1445, and a fourth negative voltage sampling capacitor "$C_6^-$" 1446.

Collectively, $S_{23}$ 1425, $S_{24}$ 1426, $S_{25}$ 1427, $S_{26}$ 1428, $S_{27}$ 1429, $S_{28}$ 1430, $S_{29}$ 1431, and $S_{30}$ 1432 are referred to as signal conducting switches, while $S_{31}$ 1433, $S_{32}$ 1434, $S_{33}$ 1435, $S_{34}$ 1436, $S_{35}$ 1437, $S_{36}$ 1438, $S_{37}$ 1439, $S_{38}$ 1440, $S_{39}$ 1441, and $S_{40}$ 1442 are collectively referred to as summing junction switches.

Downstream integrator 1104 comprises a second operational amplifier 1447 with a second inverting terminal "$T_2^-$" 1448 and a second noninverting terminal "$T_2^+$" 1449, a second positive voltage integrator feedback capacitor "$C_4^+$" 1450, and a second negative voltage integrator feedback capacitor "$C_4^-$" 1452. $T_2^-$ 1448 and $T_2^+$ 1449 together comprise second summing node $\Sigma_2$ 1102. Second positive voltage integrator feedback capacitor $C_4^+$ 1450 is connected in parallel with second operational amplifier 1447 between $T_2^-$ 1448 and a second positive voltage output signal "$V_2^+$" 1451. Second negative voltage integrator feedback capacitor $C_4^-$ 1452 is connected in parallel with second operational amplifier 1447 between $T_2^+$ 1449 and a second negative voltage output signal "$V_2^-$" 1453.

Switch $S_{23}$ 1425 is disposed between $V_o^+$ 1242 and a node "$N_9$" 1454 upstream of $C_3^+$ 1443, and switch $S_{24}$ 1426 is disposed between $V_o^-$ 1244 and a node "$N_{10}$" 1455 upstream of $C_3^-$ 1445. Likewise, switch $S_{25}$ 1427 is disposed between $V_o^-$ 1244 and node $N_9$ 1454, and switch $S_{26}$ 1428 is disposed between $V_o^+$ 1242 and node $N_{10}$ 1455.

Similarly, switch $S_{27}$ 1429 is disposed between ref 1418 and a node "$N_{13}$" 1456 upstream of $C_6^+$ 1444, and switch $S_{28}$ 1430 is disposed between refgnd 1420 and a node "$N_{14}$" 1457 upstream of $C_6^-$ 1446. Likewise, switch $S_{29}$ 1431 is disposed between refgnd 1420 and node $N_{13}$ 1456, and switch $S_{30}$ 1432 is disposed between ref 1418 and node $N_{14}$ 1457.

Switch $S_{31}$ 1433 is disposed between a node "$N_{11}$" 1458 downstream of $C_3^+$ 1443 and $T_2^-$ 1448, and switch $S_{32}$ 1434 is disposed between node $N_{11}$ 1458 and $V_{ref}$ 1422. Likewise, switch $S_{33}$ 1435 is disposed between a node "$N_{12}$" 1459 and $T_2^+$ 1449, and switch $S_{34}$ 1436 is disposed between node $N_{12}$ 1459 and $V_{ref}$ 1422.

Similarly, switch $S_{35}$ 1437 is disposed between a node "$N_{15}$" 1460 downstream of $C_6^+$ 1444 and $T_2^-$ 1448, and switch $S_{36}$ 1438 is disposed between node $N_{15}$ 1460 and $V_{ref}$ 1422. Likewise, switch $S_{37}$ 1439 is disposed between a node "$N_{16}$" 1461 downstream of $C_6^-$ 1446 and $T_2^+$ 1449, and switch $S_{38}$ 1440 is disposed between node $N_{16}$ 1461 and $V_{ref}$ 1422. However, additionally switch $S_{39}$ 1441 is disposed between node $N_{16}$ 1461 and $T_2^-$ 1448, and switch $S_{40}$ 1442 is disposed between node $N_{15}$ 1460 and $T_2^+$ 1449.

In a preferred embodiment, the value of $C_3^+$ 1443 equals the value of $C_3^-$ 1445, the value of $C_4^+$ 1450 equals the value of $C_4^-$ 1452, and the value of $C_6^+$ 1444 equals the value of $C_6^-$ 1446.

In modulator 1400, quantizer 814 produces, in addition to quantized signal y[n] 828, an inverse quantized signal "y[n].bar" 1462. When quantized signal y[n] 828 has value LOWER 902, inverse quantized signal y[n].bar 1462 has value HIGHER 904, and vice versa. Both quantized signal y[n] 828 and inverse quantized signal y[n].bar 1462 are received by half period delay buffer 1403, which produces a delayed quantized signal "dely[n]" 1463 and a delayed inverse quantized signal "dely[n].bar" 1464. Collectively, quantized signal y[n] 828, inverse quantized signal y[n].bar 1462, delayed quantized signal dely[n] 1463, and delayed inverse quantized signal dely[n].bar 1464 are referred to as quantized signals.

Quantized signal y[n] 828, inverse quantized signal y[n].bar 1462, delayed quantized signal dely[n] 1463, and delayed inverse quantized signal dely[n].bar 1464 are used with clock waveforms $\phi_1$ 1224 and $\phi_2$ 1228 to control the cycling of $S_{17}$ 1410, $S_{19}$ 1412, $S_{21}$ 1414, $S_{22}$ 1415, $S_{35}$ 1437, $S_{37}$ 1439, $S_{39}$ 1441, and $S_{40}$ 1442. For each of these switches, the clock waveform and quantized signal associated with the switch are applied to a logic AND gate (not shown). The output of the logic AND gate is used to control the position of the switch. Thus, each of these switches closes only when the clock waveform associated with the switch is in the on state and the quantized signal associated with the switch has value HIGHER 904. The switch opens when the clock waveform associated with the switch is in the off state or when the quantized signal associated with the switch has value LOWER 902.

Advantageously, in modulator 1400, input signals $V_i^+$ 1250, $V_i^-$ 1252, $V_o^+$ 1242, and $V_o^-$ 1244 in upstream and downstream cross coupled switched capacitor sampling networks 1401 and 1402 are more decoupled from reference signals ref 1418 and refgnd 1420 than are input signals $V_i^+$ 1250 and $V_i^-$ 1252 in differential switched capacitor sampling network 1200 from reference signals ref$^-$1254 and ref$^+$1256. This limits the charge injections from the signal conducting switches (e.g., $S_{13}$ 1406, $S_{14}$ 1407, $S_{15}$ 1408, $S_{16}$ 1409, $S_{27}$ 1429, $S_{28}$ 1430, $S_{29}$ 1431, and $S_{30}$ 1432) into ref 1418 and refgnd 1420, which can reduce the power consumed by the circuits that produce ref 1418 and refgnd 1420 to meet the settling requirements of modulator 1400.

It can be shown that, in this configuration, the common mode input signal $V_{ic}$ of operational amplifiers 1236 and 1447 is independent of $V_i^+$ 1250, $V_i^-$ 1252, $V_o^+$ 1242, $V_o^-$ 1244, ref 1418, and refgnd 1420. $V_{ic}$ is dependent only on $V_{ref}$ 1422 as shown in Eq. (12):

$$V_{ic}=V_{ref} \qquad \text{Eq.(12)}$$

$V_{ref}$ 1422 can be set to a value near to that of one of the two supply voltages. For example, where the two supply voltages are three volts and ground, $V_{ref}$ 1422 can be set to a value a few hundred millivolts above ground.

Furthermore, where the summing junction switches (e.g., $S_7$ 1214, $S_8$ 1216, $S_9$ 1218, $S_{10}$ 1220, $S_{17}$ 1410, $S_{18}$ 1411, $S_{19}$ 1412, $S_{20}$ 1413, $S_{21}$ 1414, $S_{22}$ 1415, $S_{31}$ 1433, $S_{32}$ 1434, $S_{33}$ 1435, $S_{34}$ 1436, $S_{35}$ 1437, $S_{36}$ 1438, $S_{37}$ 1439, $S_{38}$ 1440, $S_{39}$ 1441, and $S_{40}$ 1442) are implemented as MOSFETs, maintaining $V_{ref}$ 1422 at a value near to ground enables $V_{GS}$ of these switches to have relatively large values. By application of Eq. (10), this causes the summing junction switches to have relatively small resistances for a given size of the switches. Therefore, for a given resistance, the size of the switches can be reduced. Reducing the size of the summing junction switches proportionally reduces the charge injections from them.

Operational amplifiers 1236 and 1447 are often implemented using a single stage folded cascode topology, which can support high speed operations. Maintaining $V_{ref}$ 1422 at a value near to ground better facilitates this implementation where the input signals are received by positive channel MOSFETs (PMOSFETs) in a low voltage power supply setting.

Also, in the present invention, refgnd 1420 is set to a value equal to one of the two supply voltages. For example, where the two supply voltages are three volts and ground, refgnd 1420 can be set equal to ground. Advantageously, this can reduce the power consumed by the circuit that produces ref 1418 and refgnd 1420 as only ref 1418 needs to be realized as a voltage source.

Furthermore, for given sizes of the sampling capacitors (e.g., $C_1^+$ 1232, $C_1^-$ 1234), upstream and downstream cross coupled switched capacitor sampling networks 1401 and 1402 improve the SNR of modulator 1400 by 3 dB over a comparable modulator using differential switched capacitor sampling network 1200.

However, in the discrete time domain, as explained below, cross coupled inputs at both upstream and downstream integrators 812 and 1104 introduce a factor of $(1+z^{-1/2})$ at both locations. This can cause the transfer function for quantized signal y[n] 828 to have poles in both its analog signal x[n] 102 and quantization noise n[n] 1012 portions. The skilled artisan will appreciate that poles in the quantization noise n[n] 1012 portion of the transfer function can be indicative of a modulator with a low quality noise shaping characteristic that reduces the SNR of the modulator.

The introduction of the $(1+z^{-1/2})$ factor can be explained by tracing the circuits that are established in upstream cross coupled switched capacitor sampling network 1401 in response to the cycling of the clock waveforms of clock 1222. (The analysis for downstream cross coupled switched capacitor sampling network 1402 is identical.)

At time $t_0$, clock waveforms $\phi_1$ 1224 and $\phi_{1D}$ 1226 cycle to the on state while clock waveforms $\phi_2$ 1228 and $\phi_{2D}$ 1230 remain in the off state. In response to the on state of $\phi_1$ 1224, switches $S_8$ 1216, $S_{10}$ 1220, $S_{18}$ 1411, and $S_{20}$ 1413 close. In response to the on state of $\phi_{1D}$ 1226, switches $S_3$ 1206, $S_6$ 1212, $S_{13}$ 1406, and $S_{14}$ 1407 close. With $S_3$ 1206 and $S_8$ 1216 closed, a circuit is established between $V_i^+$ 1250 and $V_{ref}$ 1422 through $C_1^+$ 1232. This circuit allows signal $V_i^+$ 1250 to be sampled as a charge on $C_1^+$ 1232. Similarly, with $S_6$ 1212 and $S_{10}$ 1220 closed, a circuit is established between $V_i^-$ 1252 and $V_{ref}$ 1422 through $C_1^-$ 1234. This circuit allows signal $V_i^-$ 1252 to be sampled as a charge on $C_1^-$ 1234. Likewise, with $S_{13}$ 1406 and $S_{18}$ 1411 closed, a circuit is established between ref 1418 and $V_{ref}$ 1422 through $C_5^+$ 1416. This circuit allows feedback ref 1418 to be sampled as a charge on $C_5^+$ 1416. Also, with $S_{14}$ 1407 and $S_{20}$ 1413 closed, a circuit is established between refgnd 1420 and $V_{ref}$ 1422 through $C_5^-$ 1417. This circuit allows feedback refgnd 1420 to be sampled as a charge on $C_5^-$ 1417.

At time $t_1$, clock waveform $\phi_1$ 1224 cycles to the off state, while $\phi_{1D}$ 1226 remains in the on state. Clock waveforms $\phi_2$ 1228 and $\phi_{2D}$ 1230 remain in the off state. In response to the off state of $\phi_1$ 1224, switches $S_8$ 1216, $S_{10}$ 1220, $S_{18}$ 1411, and $S_{20}$ 1413 open. Opening switch $S_8$ 1216 breaks the circuit between $V_i^+$ 1250 and $V_{ref}$ 1422. This isolates the charge stored on $C_1^+$ 1232, thus effectively sampling $V_i^+$ 1250. Similarly, opening switch $S_{10}$ 1220 breaks the circuit between $V_i^-$ 1252 and $V_{ref}$ 1422. This isolates the charge stored on $C_1^-$ 1234, thus effectively sampling $V_i^-$ 1252. Likewise, opening switch $S_{18}$ 1411 breaks the circuit between ref 1418 and $V_{ref}$ 1422. This isolates the charge stored on $C_5^+$ 1416, thus effectively sampling ref 1418. Also, opening switch $S_{20}$ 1413 breaks the circuit between refgnd 1420 and $V_{ref}$ 1422. This isolates the charge stored on $C_5^-$ 1417, thus effectively sampling refgnd 1420.

At time $t_2$, clock waveform $\phi_{1D}$ 1226 cycles to the off state. Clock waveforms $\phi_1$ 1224, $\phi_2$ 1228, and $\phi_{2D}$ 1230 remain in the off state. In response to the off state of $\phi_{1D}$ 1226, switches $S_3$ 1206, $S_6$ 1212, $S_{13}$ 1406, and $S_{14}$ 1407 open. By delaying the opening of switches $S_3$ 1206, $S_6$ 1212, $S_{13}$ 1406, and $S_{14}$ 1407 until after switches $S_8$ 1216, $S_{10}$ 1220, $S_{18}$ 1411, and $S_{20}$ 1413 have been opened, and thus isolating the charges stored on $C_1^+$ 1232, $C_1^-$ 1234, $C_5^+$ 1416, and $C_5^-$ 1417, the sampled signals are unaffected by the charge injections that occur after switches $S_8$ 1216, $S_{10}$ 1220, $S_{18}$ 1411, and $S_{20}$ 1413 have been opened. Particularly, the sampled signals are not distorted by any charge injection resulting from the opening of switches $S_3$ 1206, $S_6$ 1212, $S_{13}$ 1406, and $S_{14}$ 1407.

At time $t_3$, clock waveforms $\phi_2$ 1228 and $\phi_{2D}$ 1230 cycle to the on state while clock waveforms $\phi_1$ 1224 and $\phi_{1D}$ 1226 remain in the off state. In response to the on state of $\phi_{2D}$ 1230, $S_{11}$ 1404, $S_{12}$ 1405, $S_{15}$ 1408, and $S_{16}$ 1409 close. In response to the on state of $\phi_2$ 1228, switches $S_7$ 1214, $S_9$ 1218, either switch $S_{17}$ 1410 or $S_{22}$ 1415, and either switch $S_{19}$ 1412 or $S_{21}$ 1414 close. $S_{17}$ 1410 and $S_{19}$ 1412 close when clock waveform $\phi_2$ 1228 is in the on state and delayed inverse quantized signal dely[n].bar 1464 has value HIGHER 904, while $S_{21}$ 1414 and $S_{22}$ 1415 close when clock waveform $\phi_2$ 1228 is in the on state and delayed quantized signal dely[n] 1463 has value HIGHER 904.

With switches $S_7$ 1214 and $S_{11}$ 1404 closed, a circuit is established between $V_i^-$ 1252 and inverting terminal $T^-$ 1238 through $C_1^+$ 1232. This circuit enables the charge "$Q_s^+$" on $C_1^+$ 1232, corresponding to signal $V_i^+$ 1250, to be transferred to $C_2^+$ 1246. The transferred charge $Q_s^+$ is defined by Eq. (13):

$$Q_s^+ = C_1^+(V_i^+ - V_i^-). \qquad \text{Eq.(13)}$$

Similarly, with switches $S_9$ 1218 and $S_{12}$ 1405 closed, a circuit is established between $V_i^+$ 1250 and noninverting terminal $T^+$ 1240 through $C_1^-$ 1234. This circuit enables the charge "$Q_s^-$" on $C_1^-$ 1234, corresponding to signal $V_i^-$ 1252, to be transferred to $C_2^-$ 1248. The transferred charge $Q_s^-$ is defined by Eq. (14):

$$Q_s^- = C_1^-(V_i^- - V_i^+). \qquad \text{Eq.(14)}$$

With switches $S_{15}$ 1408 and $S_{17}$ 1410 closed (i.e., delayed inverse quantized signal dely[n].bar 1464 has value HIGHER 904), a circuit is established between refgnd 1420 and inverting terminal $T^-$ 1238 through $C_5^+$ 1416. This circuit enables the charge "$Q_f^+$" on $C_5^+$ 1416, corresponding to feedback ref 1418, to be transferred to $C_2^+$ 1246. The transferred charge $Q_f^+$ is defined by Eq. (15):

$$Q_f^+ = C_5^+(refgnd - ref). \qquad \text{Eq.(15)}$$

Similarly, with switches $S_{16}$ 1409 and $S_{19}$ 1412 closed (i.e., delayed inverse quantized signal dely[n].bar 1464 has value HIGHER 904), a circuit is established between ref 1418 and noninverting terminal $T^+$ 1240 through $C_5^-$ 1417. This circuit enables the charge "$Q_f^-$" on $C_5^-$ 1417, corresponding to feedback refgnd 1420, to be transferred to $C_2^-$ 1248. The transferred charge $Q_f^-$ is defined by Eq. (16):

$$Q_f^- = C_5^-(ref - refgnd). \qquad \text{Eq.(16)}$$

Alternatively, with switches $S_{15}$ 1408 and $S_{22}$ 1415 closed (i.e., delayed quantized signal dely[n] 1463 has value HIGHER 904), a circuit is established between refgnd 1420 and noninverting terminal $T^+$ 1240 through $C_5^+$ 1416. This circuit enables the charge $Q_f^+$ on $C_5^+$ 1416, corresponding to feedback ref 1418, to be transferred to $C_2^-$ 1248. The transferred charge $Q_f^+$ is defined by Eq. (15). Similarly, with switches $S_{16}$ 1409 and $S_{21}$ 1414 closed (i.e., delayed quantized signal dely[n] 1463 has value HIGHER 904), a circuit is established between ref 1418 and inverting terminal $T^-$ 1238 through $C_5^-$ 1417. This circuit enables the charge $Q_f^-$ on $C_5^-$ 1417, corresponding to feedback refgnd 1420, to be transferred to $C_2^+$ 1246. The transferred charge $Q_f^-$ is defined by Eq. (16).

Thus, when delayed inverse quantized signal dely[n].bar 1464 has value HIGHER 904, the charge $Q^+$ at inverting terminal $T^-$ 1238 and the charge $Q^-$ at noninverting terminal $T^+$ 1240 can be expressed as shown in Eqs. (17) and (18):

$$Q^+ = [C_1^+(V_i^+ - V_i^-) + C_5^+(refgnd - ref)]; \qquad \text{Eq.(17)}$$

$$Q^- = [C_1^-(V_i^- - V_i^+) + C_5^+(refgnd - ref)]. \qquad \text{Eq.(18)}$$

Alternatively, when delayed quantized signal dely[n] 1463 has value HIGHER 904, the charge $Q^+$ at inverting terminal $T^-$ 1238 and the charge $Q^-$ at noninverting terminal $T^+$ 1240 can be expressed as shown in Eqs. (19) and (20):

$$Q^+ = [C_1^+(V_i^+ - V_i^-) + C_5^-(ref - refgnd)] \qquad \text{Eq.(19)}$$

$$Q^- = [C_1^-(V_i^- - V_i^+) + C_5^-(ref - refgnd)] \qquad \text{Eq.(20)}$$

At time $t_4$, clock waveform $\phi_2$ 1228 cycles to the off state, while $\phi_{2D}$ 1230 remains in the on state. Clock waveforms $\phi_1$ 1224 and $\phi_2$ 1228 remain in the off state. In response to the off state of $\phi_2$ 1228, switches $S_7$ 1214, $S_9$ 1218, either switch $S_{17}$ 1410 or $S_{22}$ 1415, and either switch $S_{19}$ 1412 or $S_{21}$ 1414 open. Opening switch $S_7$ 1214 breaks the circuit between $V_i^-$ 1252 and inverting terminal $T^-$ 1238. This isolates the charge transferred to $C_2^+$ 1246. Additionally, opening switch $S_9$ 1218 breaks the circuit between $V_i^+$ 1250 and noninverting terminal $T^+$ 1240. This isolates the charge transferred to $C_2^-$ 1248. Likewise, opening switch $S_{17}$ 1410 breaks the circuit between refgnd 1420 and inverting terminal $T^-$ 1238. This isolates the charge transferred to $C_5^+$ 1416. Also, opening switch $S_{19}$ 1412 breaks the circuit between ref 1418 and noninverting terminal $T^+$ 1240. This isolates the charge transferred to $C_5^-$ 1417. Alternatively, opening switch $S_{21}$ 1414 breaks the circuit between refgnd 1420 and noninverting terminal $T^+$ 1240. This isolates the charge transferred to $C_5^+$ 1416. Similarly, opening switch $S_{22}$ 1415 breaks the circuit between ref 1418 and inverting terminal $T^-$ 1238. This isolates the charge transferred to $C_5^-$ 1417.

At time $t_5$, clock waveform $\phi_{2D}$ 1230 cycles to the off state. Clock waveforms $\phi_1$ 1224, $\phi_{1D}$ 1226, and $\phi_2$ 1228 remain in the off state. In response to the off state of $\phi_{2D}$ 1230, $S_{11}$ 1404, $S_{12}$ 1405, $S_{15}$ 1408, and $S_{16}$ 1409 open. By delaying the opening of $S_{11}$ 1404, $S_{12}$ 1405, $S_{15}$ 1408, and $S_{16}$ 1409 until after switches $S_7$ 1214, $S_9$ 1218, either switch $S_{17}$ 1410 or $S_{22}$ 1415, and either switch $S_{19}$ 1412 or $S_{21}$ 1414 have been opened, the transferred signals are unaffected by the charge injection that occur after switches $S_7$ 1214, $S_9$ 1218, either switch $S_{17}$ 1410 or $S_{22}$ 1415, and either switch $S_{19}$ 1412 or $S_{21}$ 1414 have been opened. Particularly, the transferred signals are not distorted by any charge injection resulting from the opening of $S_{11}$ 1404, $S_{12}$ 1405, $S_{15}$ 1408, and $S_{16}$ 1409.

At time $t_6$, clock waveforms $\phi_1$ 1224 and $\phi_{1D}$ 1226 cycle to the on state while clock waveforms $\phi_2$ 1228 and $\phi_{2D}$ 1230 remain in the off state. The response of network 1200 to the on state of $\phi_1$ 1224 and $\phi_{1D}$ 1226 is identical to the response to the on state at time $t_0$ as explained above. Likewise, at times subsequent to $t_6$, network 1200 operates in the manner explained above. Thus, the time between $t_0$ and $t_6$ defines the period of clock 1222.

The introduction of the $(1+z^{-1/2})$ factor can be explained by comparing, for example, Eq. (6) with Eq. (17). Eq. (6) shows that, over the period of clock 1222, the charge $Q^+$ at inverting terminal $T^-$ 1238 is a function of $V_i^+$ 1250. In contrast, Eq. (17) shows that the charge $Q^+$ is a function of both $V_i^+$ 1250 and $V_i^-$ 1252. As explained above, the $V_i^-$ 1252 component of the charge $Q^+$ is transferred to $C_2^+$ 1246 during the second half of the period of clock 1222. Thus, in network 1401 (or network 1402), $V_i^+$ 1250 is effectively sampled during the first half of the period of clock 1222, while $V_i^-$ 1252 is effectively sampled during the second half of the period of clock 1222. The skilled artisan will appreciate that, in the discrete time domain, this characteristic is represented by a $(1+z^{-1/2})$ factor, where $z^{-1/2}$ indicates a delay of half of the period of clock 1222.

Fortunately, the present invention compensates for the problem posed by the $(1+z^{-1/2})$ factor by: (1) reducing the processing delay between upstream integrator 812 and downstream integrator 1104 by half of the period of clock 1222, and (2) increasing the processing delay between quantizer 814 and the portion of DAC 816 that provides feedback to upstream integrator 812 by half of the period of clock 1222.

Also, because both $V_i^+$ 1250 and $V_i^-$ 1252 contribute to the charge $Q^+$, the gain (e.g., $a_3$) of the corresponding integrator (e.g., first integrator 812) is determined by the sampling and integrator feedback capacitors as shown in Eq. (21):

$$\text{Gain} = 2C_S/C_f \qquad \text{Eq.(21)}$$

where $C_s$ is $C_1^+$ 1232 for the positive portion of network 1401 and $C_1^-$ 1234 for the negative portion of network 1401, and $C_f$ is $C_2^+$ 1246 for the positive portion of network 1401 and $C_2^-$ 1248 for the negative portion of network 1401.

Similarly, because both $V_i^+$ 1250 and $V_i^-$ 1252 contribute to the charge $Q^+$, the feedback factor is determined by the sampling and integrator feedback capacitors as shown in Eq. (22):

$$\text{Feedback Factor} = C_f/[C_f + \tfrac{1}{2}C_s]. \qquad \text{Eq.(22)}$$

Thus, where the sampling and integrator feedback capacitors of integrator 812 in modulator 1400 are the same size as the sampling and integration feedback capacitors of integrator 812 in modulator 1100, and where integrator 812 in modulator 1400 consumes the same amount of power as does integrator 812 in modulator 1100, the feedback factor of integrator 812 in modulator 1400 is larger than that of integrator 812 in modulator 1100. In this situation, the operational amplifier used to implement integrator 812 in modulator 1400 enjoys a larger bandwidth than does the operational amplifier used to implement integrator 812 in modulator 1100. As explained above, such a larger bandwidth corresponds to a faster response (or settling) time of the operational amplifier used to implement integrator 812 in modulator 1400. Alternatively, the bandwidth of the operational amplifier used to implement integrator 812 in modulator 1400 can be maintained equal to the bandwidth of the operational amplifier used to implement integrator 812 in modulator 1100 such that the power consumed by modulator 1400 is reduced.

FIGS. 15A through 15E are discrete time domain models 1500A through 1500E of second-order, single-stage, single-bit delta sigma modulators. Collectively, models 1500A through 1500E show, in the discrete time domain, the topology changes between modulators 1100 and 1400.

Figure 15A:
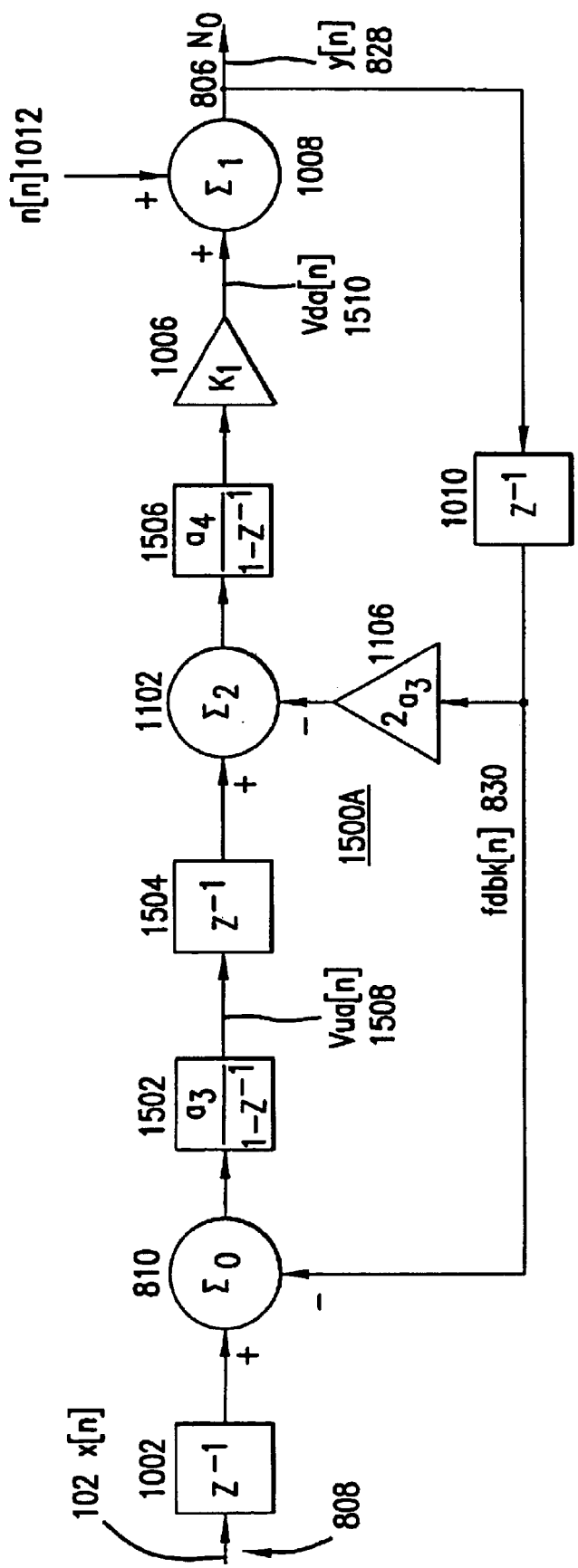
FIG. 15A is a block diagram of a discrete time domain model 1500A of modulator 1100.

FIG. 15A is a block diagram of a discrete time domain model 1500A of modulator 1100. Model 1500A comprises upstream sampling and integration delay element 1002, summing node $\Sigma_0$ 810, an upstream discrete time integrator 1502, a downstream sampling and integration delay element 1504, second summing node $\Sigma_2$ 1102, a downstream discrete time integrator 1506, gain element 1006, third summing node $\Sigma_1$ 1008, higher order compensation gain element $2a_3$ 1106, and feedback delay element 1010. Upstream sampling and integration delay element 1002, summing node $\Sigma_0$ 810, upstream discrete time integrator 1502, downstream sampling and integration delay element 1504, second summing node $\Sigma_2$ 1102, downstream discrete time integrator 1506, gain element 1006, and third summing node $\Sigma_1$ 1008 are connected, respectively, in series along signal path 808. Upstream and downstream sampling and integration delay elements 1002 and 1504 each have transfer function $z^{-1}$. Upstream and downstream discrete time integrators 1502 and 1506 each have transfer function $1/(1-z^{-1})$. Upstream discrete time integrator 1502 has gain $a_3$. Downstream discrete time integrator 1504 has gain $a_4$. Gain element 1006 has gain $k_1$. Feedback delay element 1010 is connected in parallel with signal path 808 between node $N_0$ 806 and summing node $\Sigma_0$ 810. Feedback delay element 1010 has transfer function $z^{-1}$. Higher order compensation gain element $2a_3$ 1106 is connected between feedback delay element 1010 and second summing node $\Sigma_2$ 1102.

In model 1500A, quantization noise n[n] 1012 is added at second summing node $\Sigma_1$ 1008. An upstream integrated signal "$v_{ua}$[n]" 1508 is produced between upstream discrete time integrator 1502 and downstream sampling and integration delay element 1504. A downstream integrated signal "$v_{da}$[n]" 1510 is produced between downstream discrete time integrator 1506 and gain element 1006. Recalling Eq. (3) (reproduced below), quantized signal y[n] 828 for model 1500A can be expressed as:

$$y[n]=x[n]z^{-2}+n[n](1-z^{-1})^2. \quad \text{Eq.(3)}$$

Desirably, modulator 1100 highpass filters quantization noise n[n] 1012.

Unfortunately, where modulator 1100 uses differential switched capacitor sampling network 1200, $V_{ic}$ of the operational amplifiers that implement integrators 1102 and 1502 are dependent on $V_i^+$ 1250, $V_i^-$ 1252, $V_o^+$ 1242, $V_o^-$ 1244, ref$^-$ 1254, ref$^+$ 1256, and $V_{CM}$ 1264. Because (ref$^+$+ref$^-$)/2 and $V_{CM}$ 1264 are traditionally maintained at values midway between the two supply voltages, modulator 1100 can consume significant amounts of power. This is particularly the case where the circuits that produce reference signals ref$^-$ 1254 and ref$^+$ 1256 must meet specific settling requirements in the presence of charge injections from signal conducting switches (e.g., $S_1$ 1202, $S_2$ 1204, $S_3$ 1206, $S_4$ 1208, $S_5$ 1210, and $S_6$ 1212). These charge injections can be substantial because the signal conducting switches are closely coupled to reference signals ref$^-$ 1254 and ref$^+$ 1256.

Furthermore, where the summing junction switches (e.g., $S_7$ 1214, $S_8$ 1216, $S_9$ 1218, and $S_{10}$ 1220) are implemented as MOSFETs, maintaining ($V_i^+$+$V_i^-$)/2, (ref$^+$+ref$^-$)/2, and $V_{CM}$ at values midway between the two supply voltages causes $V_{GS}$ of these switches to have relatively small values. By application of Eq. (8), this causes the summing junction switches to have relatively large resistances, which typically are associated with relatively large switches. Large switches can cause correspondingly large charge injections.

Figure 15B:
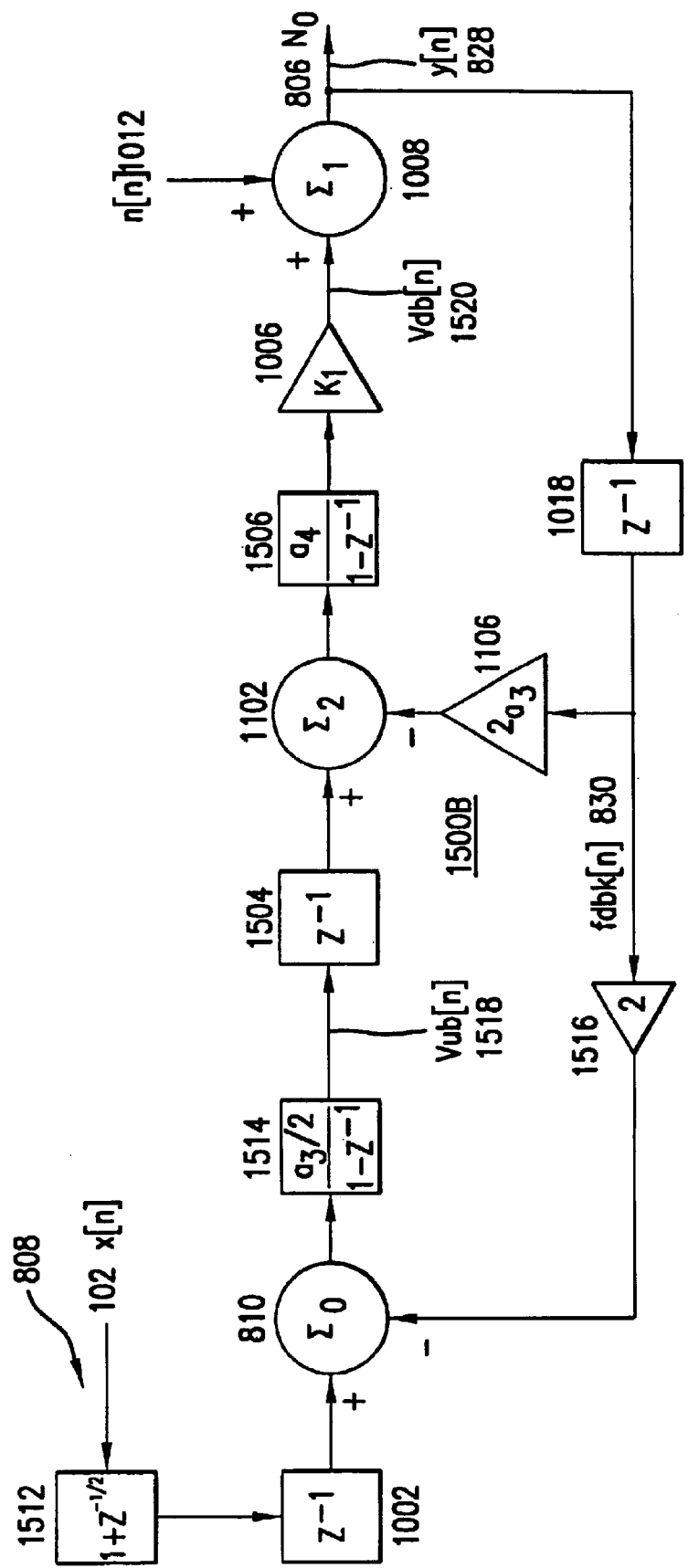
FIG. 15B is a block diagram of a discrete time domain model 1500B of a second-order, single-stage, single-bit delta sigma modulator in which sampling functional component 202 of upstream integrator 812 is realized as upstream cross coupled switched capacitor sampling network 1401.

FIG. 15B is a block diagram of a discrete time domain model 1500B of a second-order, single-stage, single-bit delta sigma modulator in which sampling functional component 202 of upstream integrator 812 is realized as upstream cross coupled switched capacitor sampling network 1401. Model 1500B comprises model 1500A and an upstream cross coupled element 1512. Upstream cross coupled element 1512 is connected upstream of first summing node $\Sigma_0$ 810 and has a transfer function of "$(1+z^{-1/2})$". In comparison with modulator 1100, modulator 1400 samples charges during both halves of the period of clock 1222. To accommodate the additional charge received during the second half of the period of clock 1222, upstream discrete time integrator 1502 is replaced by an upstream discrete time integrator 1514. Upstream discrete time integrator 1514 has transfer function $1/(1-z^{-1})$, but a gain of "$a_3/2$". To compensate fdbk[n] 830 for the reduction in gain associated with upstream discrete time integrator 1514, a second gain element 1516 is connected in parallel with higher order compensation gain element $2a_3$ 1106 between feedback delay element 1010 and first summing node $\Sigma_0$ 810. Second gain element 1516 has a gain of two.

An upstream integrated signal "$v_{ub}$[n]" 1518 is produced between upstream discrete time integrator 1514 and downstream sampling and integration delay element 1504. A downstream integrated signal "$v_{db}$[n]" 1520 is produced between downstream discrete time integrator 1506 and gain element 1006. Quantized signal y[n] 828 for model 1500B can be expressed as shown in Eq. (23):

$$y[n]=x[n](1+z^{-1/2})z^{-2}+n[n](1-z^{-1})^2. \quad \text{Eq.(23)}$$

Desirably, the modulator of model 1500B highpass filters quantization noise n[n] 1012. Additionally, because input signals $V_i^+$ 1250 and $V_i^-$ 1252 in upstream cross coupled switched capacitor sampling network 1401 are more decoupled from reference signals ref 1418 and refgnd 1420 than are input signals $V_i^+$ 1250 and $V_i^-$ 1252 in differential switched capacitor sampling network 1200 from reference signals ref$^-$ 1254 and ref$^+$ 1256, the charge injections from the signal conducting switches (e.g., $S_{13}$ 1406, $S_{14}$ 1407, $S_{15}$ 1408, and $S_{16}$ 1409) into ref 1418 and refgnd 1420 are limited. This can reduce the power consumed by the circuits that produce ref 1418 and refgnd 1420 to meet the settling requirements of the modulator of model 1500B.

Furthermore, where the summing junction switches (e.g., $S_7$ 1214, $S_8$ 1216, $S_9$ 1218, $S_{10}$ 1220, $S_{17}$ 1410, $S_{18}$ 1411, $S_{19}$ 1412, $S_{20}$ 1413, $S_{21}$ 1414, and $S_{22}$ 1415) are implemented as MOSFETs, maintaining $V_{ref}$ 1422 at a value near to ground enables $V_{GS}$ of these switches to have relatively large values. By application of Eq. (10), this causes the summing junction switches to have relatively small resistances for a given size of the switches. Therefore, for a given resistance, the size of the switches can be reduced. Reducing the size of the summing junction switches proportionally reduces the charge injections from them.

However, the modulator of model 1500B does not realize the full potential of advantages of cross coupled input circuits because cross coupled switched capacitor sampling network 1401 is used only by upstream integrator 812.

Figure 15C:
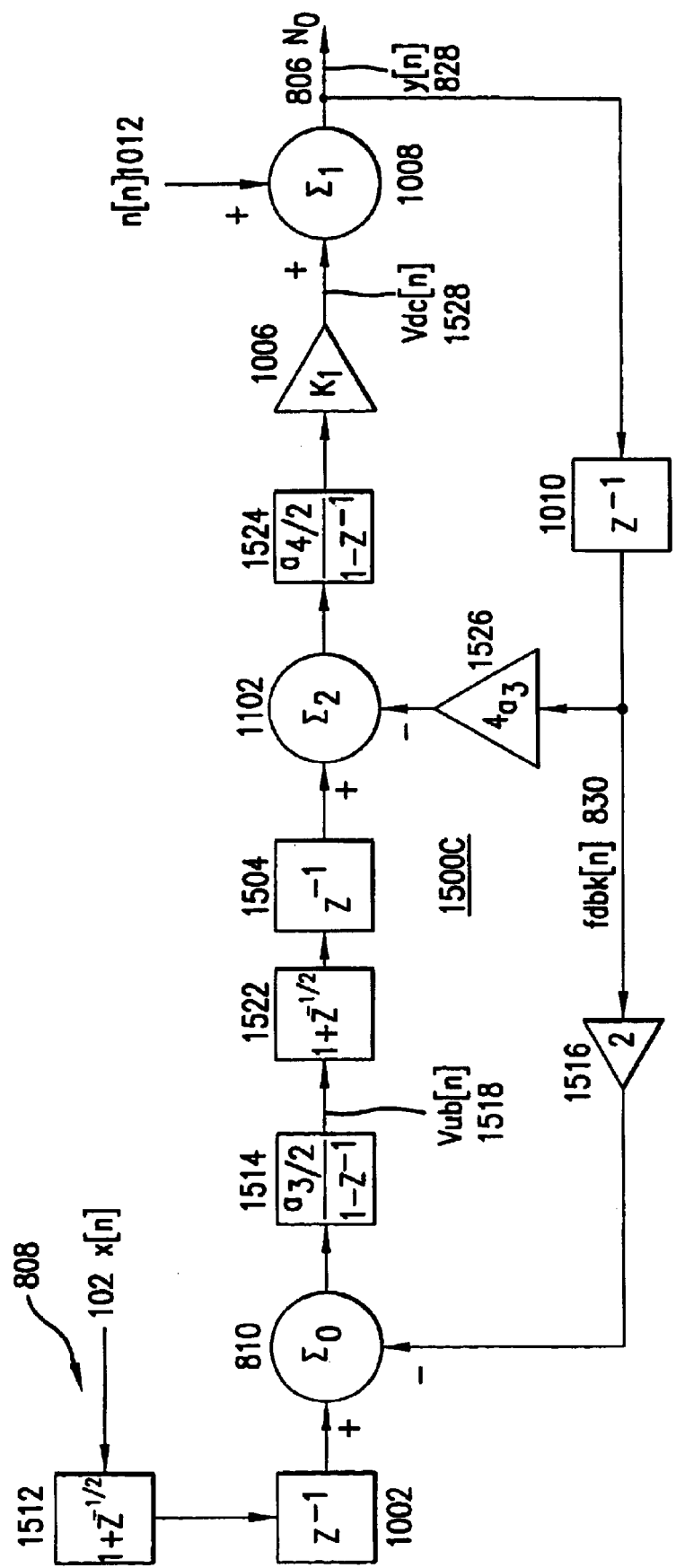
FIG. 15C is a block diagram of a discrete time domain model 1500C of a second-order, single-stage, single-bit delta sigma modulator having integrators 812 and 1104 with cross coupled switched capacitor sampling networks 1401 and 1402.

FIG. 15C is a block diagram of a discrete time domain model 1500C of a second-order, single-stage, single-bit delta sigma modulator having integrators 812 and 1104 with cross coupled switched capacitor sampling networks 1401 and 1402. Model 1500C comprises model 1500B and a downstream cross coupled element 1522. Downstream cross coupled element 1522 is connected between upstream discrete time integrator 1514 and downstream sampling and integration delay element 1504. Downstream cross coupled element 1522 has a transfer function of "$(1+z^{-1/2})$". To accommodate the additional charge received during the second half of the period of clock 1222, downstream discrete time integrator 1506 is replaced by a downstream discrete time integrator 1524. Downstream discrete time integrator 1524 has transfer function $1/(1+z^{-1})$, but a gain of "$a_4/2$". To compensate fdbk[n] 830 for the reduction in gain associated with downstream discrete time integrator 1524, higher order compensation gain element $2a_3$ 1106 is replaced by a higher order compensation gain element "$4a_3$" 1526 having a gain of "$4a_3$".

Upstream integrated signal $v_{ub}$[n] 1518 is produced between upstream discrete time integrator 1514 and downstream cross coupled element 1522. A downstream integrated signal "$v_{dc}$[n]" 1528 is produced between downstream discrete time integrator 1524 and gain element 1006. Quantized signal y[n] 828 for model 1500C can be expressed as shown in Eq. (24):

$$y[n]=[\tfrac{1}{2}x[n](1+z^{-1/2})^2z^{-2}+n[n](1-z^{-1})^2]/[1-z+z^{-2}+z^{-5/2}]. \quad \text{Eq.(24)}$$

Although the modulator of model 1500C is configured to realize the full potential of advantages of cross coupled input circuits, unfortunately, the presence of network 1402 in the feedback loop causes the transfer function for quantized signal y[n] to have poles in both its analog signal x[n] 102 and quantization noise n[n] 1012 portions. The skilled artisan will appreciate that poles in the quantization noise n[n] 1012 portion of the transfer function can be indicative of a modulator with a low quality noise shaping characteristic that reduces the SNR of the modulator. The present invention compensates for this problem by: (1) reducing the processing delay between upstream integrator 812 and downstream integrator 1104 by half of the period of clock 1222, and (2) increasing the processing delay between quantizer 814 and the portion of DAC 816 that provides feedback to upstream integrator 812 by half of the period of clock 1222.

Figure 15D:
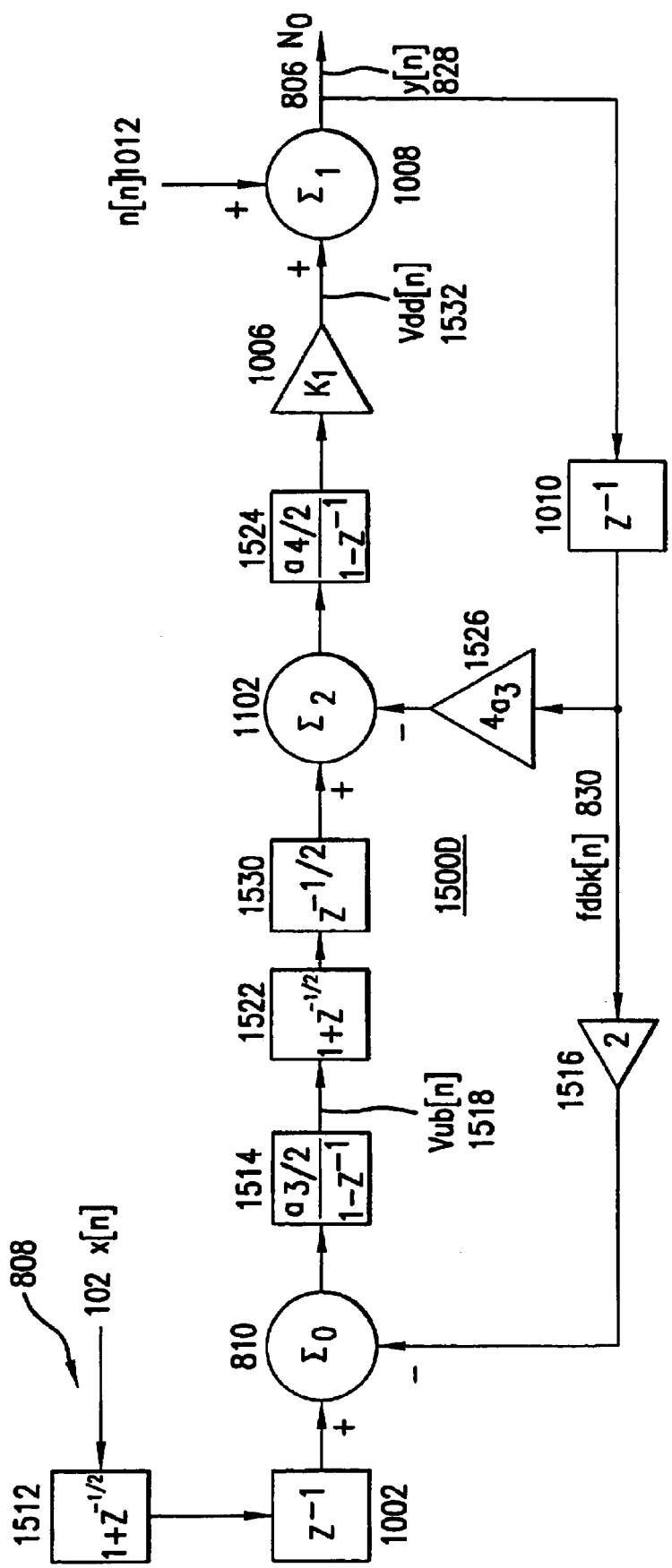
FIG. 15D is a block diagram of a discrete time domain model 1500D of a pipelined second-order, single-stage, single-bit delta sigma modulator having integrators 812 and 1104 with cross coupled switched capacitor sampling networks 1401 and 1402.

FIG. 15D is a block diagram of a discrete time domain model 1500D of a pipelined second-order, single-stage, single-bit delta sigma modulator having integrators 812 and 1104 with cross coupled switched capacitor sampling networks 1401 and 1402. Model 1500D comprises model 1500C except that downstream sampling and integration delay element 1504 is replaced by a downstream sampling and integration delay element 1530. Downstream sampling and integration delay element 1530 has a transfer function of "$z^{-1/2}$", which represents a reduction in sampling and integration delay by half of the period of clock 1222. Such a reduction in sampling and integration delay is realized by a pipelined clock. Upstream integrated signal $v_{ub}[n]$ 1518 is produced between upstream discrete time integrator 1514 and downstream cross coupled element 1522. A downstream integrated signal "$v_{dd}[n]$" 1532 is produced between downstream discrete time integrator 1524 and gain element 1006.

In the modulator of model 1500D, the pipelined clock acts to reduce the processing delay between upstream integrator 812 and downstream integrator 1104 by half of the period of clock 1222. The pipelined clock is realized by reversing the alignment of clock waveforms (i.e., $\phi_1$ 1224, $\phi_{1D}$ 1226, $\phi_2$ 1228, and $\phi_{2D}$ 1230) with the switches of network 1402 (i.e., $S_{23}$ 1425, $S_{24}$ 1426, $S_{25}$ 1427, $S_{26}$ 1428, $S_{27}$ 1429, $S_{28}$ 1430, $S_{29}$ 1431, $S_{30}$ 1432, $S_{31}$ 1433, $S_{32}$ 1434, $S_{33}$ 1435, $S_{34}$ 1436, $S_{35}$ 1437, $S_{36}$ 1438, $S_{37}$ 1439, $S_{38}$ 1440, $S_{39}$ 1441, and $S_{40}$ 1442) from the alignment of clock waveforms with the switches of network 1401 (i.e., $S_3$ 1206, $S_6$ 1212, $S_7$ 1214, $S_8$ 1216, $S_9$ 1218, $S_{10}$ 1220, $S_{11}$ 1404, $S_{12}$ 1405, $S_{13}$ 1406, $S_{14}$ 1407, $S_{15}$ 1408, $S_{16}$ 1409, $S_{17}$ 1410, $S_{18}$ 1411, $S_{19}$ 1412, $S_{20}$ 1413, $S_{21}$ 1414, and $S_{22}$ 1415) so that the sampling phase of network 1402 corresponds to the integration phase of network 1401, and vice versa.

So, while in network 1401, $S_8$ 1216, $S_{10}$ 1220, $S_{18}$ 1411, and $S_{20}$ 1413 cycle in response to clock waveform $\phi_1$ 1224, in network 1402, $S_{32}$ 1434, $S_{34}$ 1436, $S_{36}$ 1438, and $S_{38}$ 1440 cycle in response to clock waveform $\phi_2$ 1228. Similarly, while in network 1401, $S_3$ 1206, $S_6$ 1212, $S_{13}$ 1406, and $S_{14}$ 1407 cycle in response to clock waveform $\phi_{1D}$ 1226, in network 1402, $S_{23}$ 1425, $S_{24}$ 1426, $S_{27}$ 1429, and $S_{28}$ 1430 cycle in response to clock waveform $\phi_{2D}$ 1230. Likewise, while in network 1401, $S_7$ 1214, $S_9$ 1218, $S_{17}$ 1410, $S_{19}$ 1412, $S_{21}$ 1414, and $S_{22}$ 1415 cycle in response to clock waveform $\phi_2$ 1228, in network 1402, $S_{31}$ 1433, $S_{33}$ 1435, $S_{35}$ 1437, $S_{37}$ 1439, $S_{39}$ 1441, and $S_{40}$ 1442 cycle in response to clock waveform $\phi_1$ 1224. Also, while in network 1401, $S_{11}$ 1404, $S_{12}$ 1405, $S_{15}$ 1408, and $S_{16}$ 1409 cycle in response to clock waveform $\phi_{2D}$ 1230, in network 1402, $S_{25}$ 1427, $S_{26}$ 1428, $S_{29}$ 1431, and $S_{30}$ 1432 cycle in response to clock waveform $\phi_{1D}$ 1226.

FIGS. 16A through 16D are graphs 1600A through 1600D of integrated signals $v_{ub}[n]$ 1518, $v_{db}[n]$ 1520, $v_{dc}[n]$ 1528, and $v_{dd}[n]$ 1532. Collectively, graphs 1600A through 1600D show how, in model 1500D, reducing the processing delay between upstream integrator 812 and downstream integrator 1104 by half of the period of clock 1222 partially compensates for the poles in the quantization noise n[n] 1012 portion of the transfer function for quantized signal y[n] 828.

Figure 16A:
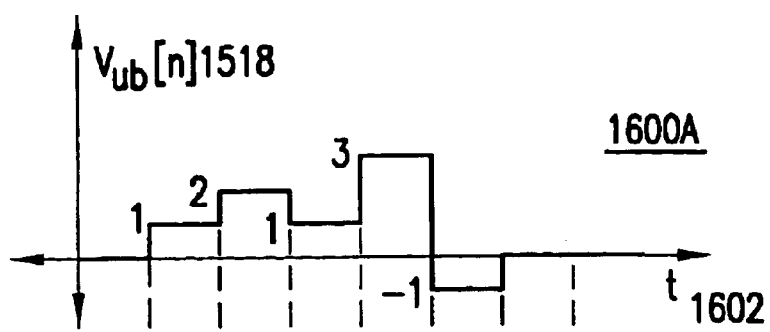
FIG. 16A is a graph 1600A of integrated signal $v_{ub}[n]$ 1518 versus a time "t" 1602.

FIG. 16A is a graph 1600A of integrated signal $v_{ub}[n]$ 1518 versus a time "t" 1602. Recall that integrated signal $v_{ub}[n]$ 1518 is produced by the modulators of models 1500B, 1500C, and 1500D downstream of upstream discrete time integrator 1514 and includes the effect of upstream cross coupled element 1512. Graph 1600A has an arbitrary shape and is presented for illustrative purposes.

Figure 16B:
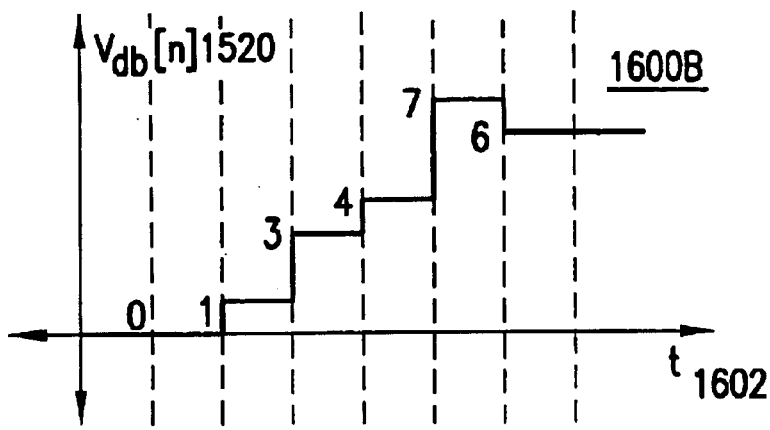
FIG. 16B is a graph 1600B of integrated signal $v_{db}[n]$ 1520 versus time t 1602.

FIG. 16B is a graph 1600B of integrated signal $v_{db}[n]$ 1520 versus time t 1602. Integrated signal $v_{db}[n]$ 1520 of graph 1600B does not include the effect of analog feedback signal fdbk[n] 830, but rather is limited to downstream sampling and integration delay element 1504 and downstream discrete time integrator 1506. Integrated signal $v_{db}[n]$ 1520 can be expressed as shown in Eq. (25):

$$v_{db}[n] = v_{ub}[n]z^{-1}/(1-z^{-1}). \qquad \text{Eq.(25)}$$

In the time domain, Eq. (25) is recast as shown in Eq. (26):

$$v_{db}[n] = v_{db}[n-1] + v_{ub}[n-1]. \qquad \text{Eq.(26)}$$

Using Eq. (26) and graph 1600A, graph 1600B shows integrated signal $v_{db}[n]$ 1520.

Figure 16C:
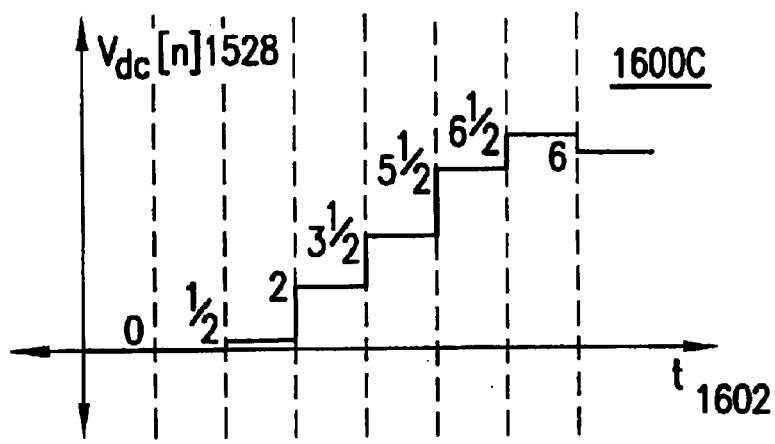
FIG. 16C is a graph 1600C of integrated signal $v_{dc}[n]$ 1528 versus time t 1602.

FIG. 16C is a graph 1600C of integrated signal $v_{dc}[n]$ 1528 versus time t 1602. Integrated signal $v_{dc}[n]$ 1528 of graph 1600C does not include the effect of analog feedback signal fdbk[n] 830, but rather is limited to downstream cross coupled element 1522, downstream sampling and integration delay element 1504, and downstream discrete time integrator 1524. Integrated signal $v_{dc}[n]$ 1528 can be expressed as shown in Eq. (27):

$$v_{dc}[n] = \tfrac{1}{2}v_{ub}[n](1+z^{-1/2})z^{-1}/(1-z^{-1}). \qquad \text{Eq.(27)}$$

In the time domain, Eq. (27) is recast as shown in Eq. (28):

$$v_{dc}[n] = v_{dc}[n-1] + \tfrac{1}{2}v_{ub}[n-1] + \tfrac{1}{2}v_{ub}[n-\tfrac{1}{2}]. \qquad \text{Eq.(28)}$$

Using Eq. (28) and graph 1600A, graph 1600C shows integrated signal $v_{dc}[n]$ 1528.

Figure 16D:
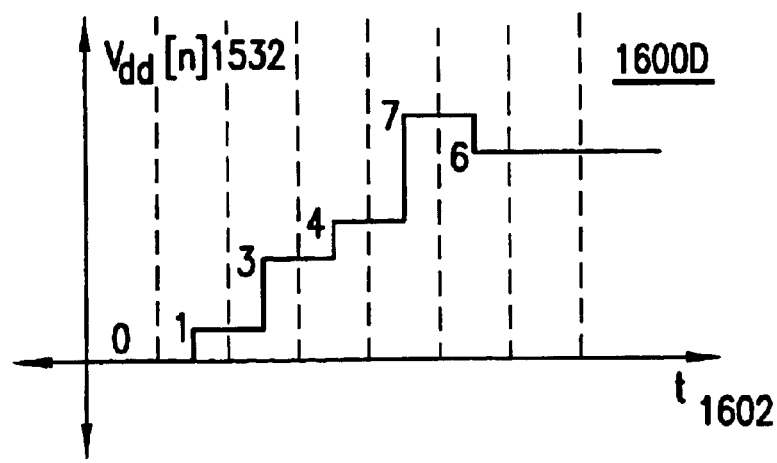
FIG. 16D is a graph 1600D of integrated signal $v_{dd}[n]$ 1532 versus time t 1602.

FIG. 16D is a graph 1600D of integrated signal $v_{dd}[n]$ 1532 versus time t 1602. Integrated signal $v_{dd}[n]$ 1532 of graph 1600D does not include the effect of analog feedback signal fdbk[n] 830, but rather is limited to downstream cross coupled element 1522, downstream sampling and integration delay element 1530, and downstream discrete time integrator 1524. Integrated signal $v_{dd}[n]$ 1532 can be expressed as shown in Eq. (29):

$$v_{dd}[n] = \tfrac{1}{2}v_{ub}[n](1+z^{-1/2})z^{-1/2}/(1-z^{-1}). \qquad \text{Eq.(29)}$$

In the time domain, Eq. (29) is recast as shown in Eq. (30):

$$v_{dd}[n] = v_{dd}[n-1] + \tfrac{1}{2}v_{ub}[n-\tfrac{1}{2}] + \tfrac{1}{2}v_{ub}[n-1]. \qquad \text{Eq.(30)}$$

Using Eq. (30) and graph 1600A, graph 1600D shows integrated signal $v_{dd}[n]$ 1532.

Recall that integrated signal $v_{db}[n]$ 1520 is associated with the modulator of model 1500B. In model 1500B, quantized signal y[n] 828 has the transfer function shown in Eq. (23). Desirably, there are no poles in the quantization noise n[n] 1012 portion of the transfer function shown in Eq. (23). A comparison of the shapes of graphs 1600B, 1600C, and 1600D shows that the shape of graph 1600D is similar to the shape of graph 1600B, and that the shapes of both graphs 1600D and 1600B are different from the shape of graph 1600C. Further scrutiny shows that each change in value along graph 1600D is equal to a corresponding change in value along graph 1600B. For, example, when graph 1600B changes value from zero to one, graph 1600D changes value from zero to one, when graph 1600B changes value from one to three, graph 1600D changes value from one to three, etc. Thus, graph 1600D shows that by reducing the processing delay between upstream integrator 812 and downstream integrator 1104 by half of the period of clock 1222, downstream cross coupled element 1522 effectively becomes a gain element with a gain of two. This gain is subsequently reduced by having the gain of downstream discrete time integrator 1524 set at $a_4/2$.

Qualitatively, within the period of clock 1222, downstream integrator 1104 receives, from upstream integrator 812, both a current charge and a charge that is delayed by half of the period of clock 1222. However, because upstream integrator 812 does not receive a new charge during the second half of the period of clock 1222, but rather maintains the current charge, the current charge is twice received by downstream integrator 1104 during the period of clock 1222. Thus, downstream cross coupled element 1522 effectively becomes a gain element with a gain of two.

Returning to FIG. 15D, quantized signal y[n] 828 for model 1500D can be expressed as shown in Eq. (31):

$$y[n] = [(1/4)x[n](1+z^{-1/2})^2 z^{-3/2} + n[n](1-z^{-1})^2] / [1 + 1/2 z^{-3/2} - 1/2 z^{-2}] \qquad \text{Eq.(31)}$$

Unfortunately, quantized signal y[n] 828 of Eq. (31) still has poles in both its analog signal x[n] 102 and quantization noise n[n] 1012 portions. This is because, while the processing delay between upstream integrator 812 and downstream integrator 1104 of the modulator of model 1500D was reduced by half of the period of clock 1222, the processing delay between quantizer 814 and the portion of DAC 816 that provides feedback to upstream integrator 812 was not correspondingly increased.

This situation is also presented graphically in FIGS. 16A through 16D. While FIGS. 16A through 16D show that changes in value along graphs 1600B and 1600C (i.e., $v_{db}[n]$ 1520 and $v_{dc}[n]$ 1528) lag changes in value along graph 1600A (i.e., $v_{ub}[n]$ 1518) by the period of clock 1222, they also show that changes in value along graph 1600D (i.e., $v_{dd}[n]$ 1532) lag changes in value along graph 1600A (i.e., $v_{ub}[n]$ 1518) only by half of the period of clock 1222.

Figure 15E:
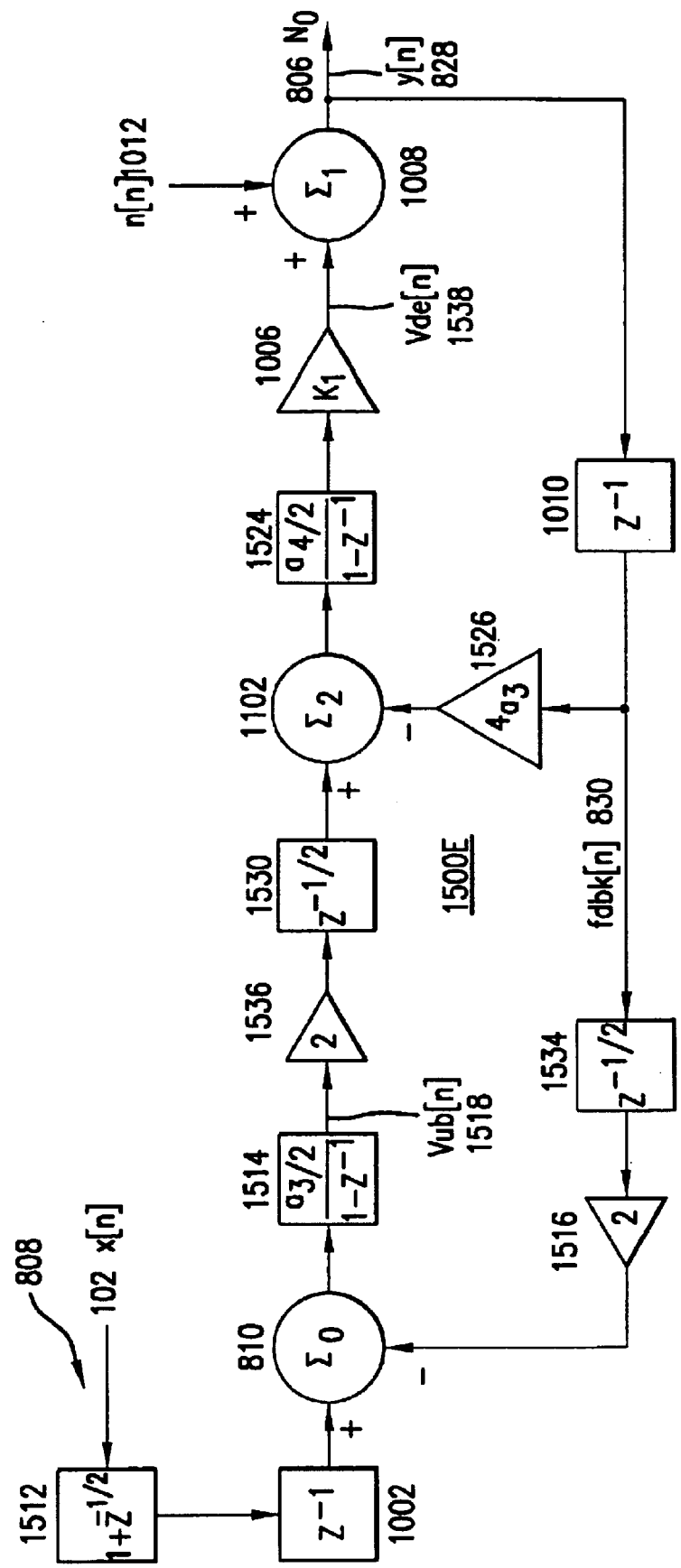
FIG. 15E is a block diagram of a discrete time domain model 1500E of modulator 1400.

FIG. 15E is a block diagram of a discrete time domain model 1500E of modulator 1400. Model 1500E comprises model 1500D and a second feedback delay element 1534. Second feedback delay element 1534 is connected in parallel with higher order compensation gain element $4a_3$ 1526 between feedback delay element 1010 and second gain element 1516. Second feedback delay element 1534 has a transfer function of "$z^{-1/2}$", which represents an increase in feedback delay by half of the period of clock 1222.

Furthermore, as explained above, because reducing the processing delay between upstream integrator 812 and downstream integrator 1104 by half of the period of clock 1222 effectively makes downstream cross coupled element 1522 effectively a gain element with a gain of two, downstream cross coupled element 1522 is replaced by a third gain element 1536 with a gain of two. Upstream integrated signal $v_{ub}[n]$ 1518 is produced between upstream discrete time integrator 1514 and third gain element 1536. A downstream integrated signal "$v_{dc}[n]$" 1538 is produced between downstream discrete time integrator 1524 and gain element 1006.

In modulator 1400, the processing delay between quantizer 814 and the portion of DAC 816 that provides feedback to upstream integrator 812 is increased by the half cycle of clock 1222 by connecting a half period delay buffer 1403 between quantizer 814 and the portion of DAC 816 that provides feedback to upstream integrator 812.

Delayed quantized signal dely[n] 1463 and delayed inverse quantized signal dely[n].bar 1464 correspond, respectively, to quantized signal y[n] 828 and inverse quantized signal y[n].bar 1462. When quantized signal y[n] 828 changes value at a given point in time, delayed quantized signal dely[n] 1463 changes value at a time a half cycle of clock 1222 later than the given time. Likewise, when inverse quantized signal y[n].bar 1462 changes value at a given point in time, delayed inverse quantized signal dely[n].bar 1464 changes value at a time a half cycle of clock 1222 later than the given time. For example, when quantized signal y[n] 828 changes value from LOWER 902 to HIGHER 904 at a given time, inverse quantized signal y[n].bar 1462 contemporaneously changes value from HIGHER 904 to LOWER 902. At a time a half cycle of clock 1222 later than the given time, delayed quantized signal dely[n] 1463 changes value from LOWER 902 to HIGHER 904, and delayed inverse quantized signal dely[n].bar 1464 changes value from HIGHER 904 to LOWER 902.

For the switches associated with the portion of DAC 816 that provides feedback to upstream integrator 812 (i.e., associated with network 1401), $S_{17}$ 1410 and $S_{19}$ 1412 close when clock waveform $\phi_2$ 1228 is in the on state and delayed inverse quantized signal dely[n].bar 1464 has value HIGHER 904, while $S_{21}$ 1414 and $S_{22}$ 1415 close when clock waveform $\phi_2$ 1228 is in the on state and delayed quantized signal dely[n] 1463 has value HIGHER 904. Likewise, for the switches associated with the portion of DAC 816 that provides feedback to downstream integrator 1104 (i.e., associated with network 1402), $S_{35}$ 1437 and $S_{37}$ 1439 close when clock waveform $\phi_1$ 1224 is in the on state and inverse quantized signal y[n].bar 1462 has value HIGHER 904, while $S_{39}$ 1441 and $S_{40}$ 1442 close when clock waveform $\phi_1$ 1224 is in the on state and quantized signal y[n] 828 has value HIGHER 904.

Thus, the switches associated with the portion of DAC 816 that provides feedback to upstream integrator 812 (i.e., associated with network 1401) are controlled by delayed quantized signals dely[n] 1463 and dely[n].bar 1464, while the switches associated with the portion of DAC 816 that provides feedback to downstream integrator 1104 (i.e., associated with network 1402) are controlled by quantized signals y[n] 812 and y[n].bar 1462. In this manner, modulator 1400 increases the processing delay between quantizer 814 and the portion of DAC 816 that provides feedback to upstream integrator 812 by the half cycle of clock 1222.

Returning to FIG. 15E, quantized signal y[n] 828 for model 1500E can be expressed as shown in Eq. (32):

$$y[n] = 1/2 x[n](1+z^{-1/2})z^{-3/2} + n[n](1-z^{-1})^2. \qquad \text{Eq.(32)}$$

Thus, Eq. (32) shows that modulator 1400 removes the poles from the analog signal x[n] 102 and quantization noise n[n] 1012 portions of the transfer function for quantized signal y[n] 828 by: (1) reducing the processing delay between upstream integrator 812 and downstream integrator 1104 by half of the period of clock 1222, and (2) increasing the processing delay between quantizer 814 and the portion of DAC 816 that provides feedback to upstream integrator 812 by half of the period of clock 1222.

Desirably, modulator 1400 highpass filters quantization noise n[n] 1012. Additionally, because $V_i^+$ 1250 and $V_i^-$ 1252 in upstream cross coupled switched capacitor sampling network 1401, and $V_o^+$ 1242 and $V_o^-$ 1244 in downstream cross coupled switched capacitor sampling network 1402 are more decoupled from reference signals ref 1418 and refgnd 1420 than are $V_i^+$ 1250 and $V_i^-$ 1252 in differential switched capacitor sampling network 1200 from reference signals ref⁻ 1254 and ref⁺ 1256, the charge injections from the signal conducting switches (e.g., $S_{13}$ 1406, $S_{14}$ 1407, $S_{15}$ 1408, $S_{16}$ 1409, $S_{27}$ 1429, $S_{28}$ 1430, $S_{29}$ 1431, and $S_{30}$ 1432) into ref 1418 and refgnd 1420 are limited. This can reduce the power consumed by the circuits that produce ref 1418 and refgnd 1420 to meet the settling requirements of modulator 1400.

Furthermore, where the summing junction switches (e.g., $S_7$ 1214, $S_8$ 1216, $S_9$ 1218, $S_{10}$ 1220, $S_{17}$ 1410, $S_{18}$ 1411, $S_{19}$ 1412, $S_{20}$ 1413, $S_{21}$ 1414, $S_{22}$ 1415, $S_{31}$ 1433, $S_{32}$ 1434, $S_{33}$ 1435, $S_{34}$ 1436, $S_{35}$ 1437, $S_{36}$ 1438, $S_{37}$ 1439, $S_{38}$ 1440, $S_{39}$ 1441, and $S_{40}$ 1442) are implemented as MOSFETs, maintaining $V_{ref}$ 1422 at a value near to ground enables $V_{GS}$ of these switches to have relatively large values. By application of Eq. (10), this causes the summing junction switches to have relatively small resistances for a given size of the switches. Therefore, for a given resistance, the size of the switches can be reduced. Reducing the size of the summing junction switches proportionally reduces the charge injections from them.

Thus, modulator 1400 realizes the full potential of advantages of cross coupled input circuits because each of upstream and downstream integrators 812 and 1104 uses a cross coupled switched capacitor network. So, for comparable realizations of modulators 1100 and 1400, modulator 1400 reduces distortions due to charge injections, consumes less power, and enjoys a 3 dB improvement in SNR.

Although the present invention has been described in the context of second-order, single-stage, single-bit delta sigma modulator 1400, the skilled artisan will appreciate that the present invention encompasses other modulator topologies and therefore is not limited to a second-order, single-stage, single-bit configuration.

FIG. 17 is a flow chart of a method 1700 of reducing distortions due to charge injections in a high order delta sigma modulator stage having integrators with cross coupled input circuits. In method 1700, at a step 1702, a first integrator is caused to sample during a first phase of a clock and to sample and integrate during a second phase of the clock. For example, in modulator 1400, first integrator 812 samples during the first half of the period of clock 1222, and both samples and integrates during the second half of the period of clock 1222. At a step 1704, a second integrator is caused to sample and integrate during the first phase and to sample during the second phase. For example, in modulator 1400, second integrator 1104 both samples and integrates during the first half of the period of clock 1222, and samples during the second half of the period of clock 1222. At a step 1706, a reference voltage, which is coupled to a transistor summing junction switch in the integrators, is set less than an average of two power supply voltages for the high order delta sigma modulator stage. For example, in modulator 1400, where the two supply voltages are three volts and ground, $V_{ref}$ 1422 can be set to a value a few hundred millivolts above ground.

Figure 18:
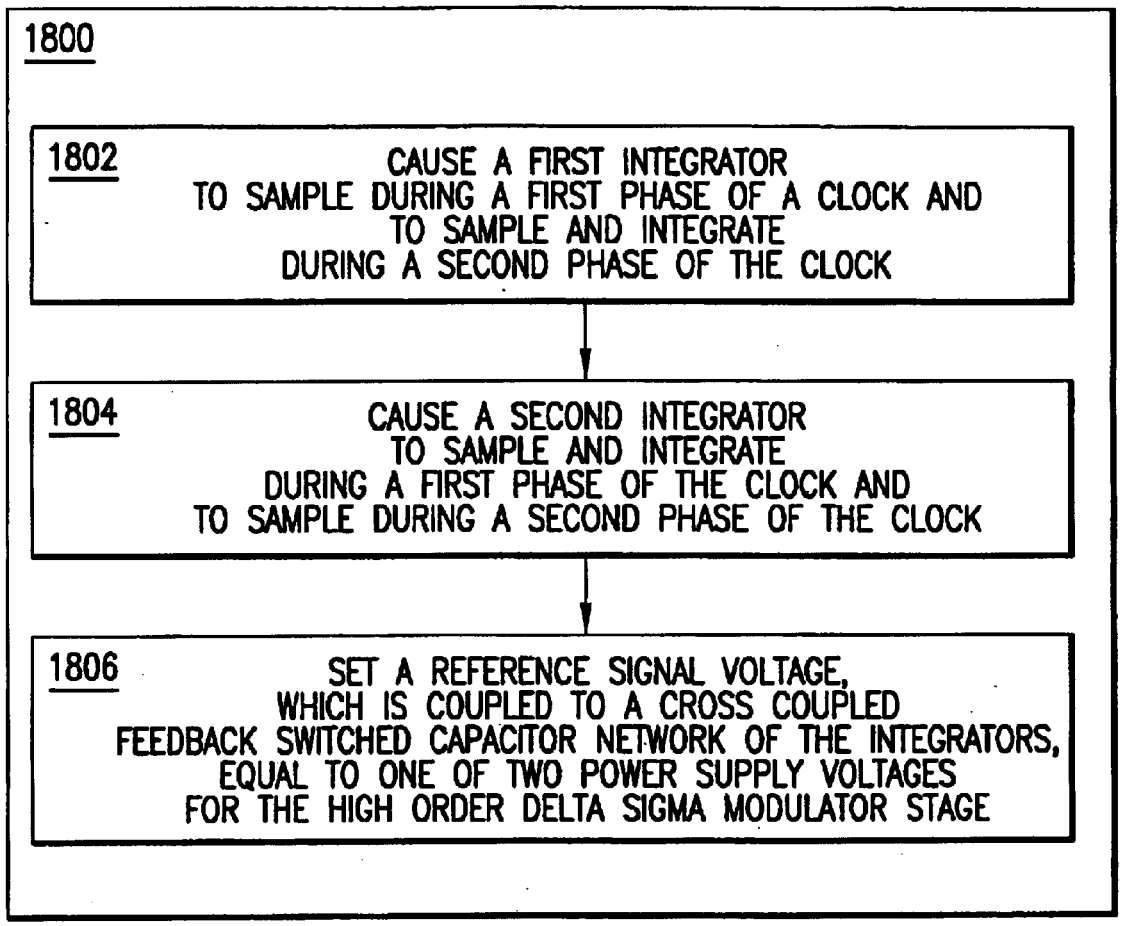
FIG. 18 is a flow chart of a method 1800 of reducing power consumed by a high order delta sigma modulator stage having integrators with cross coupled input circuits.

FIG. 18 is a flow chart of a method 1800 of reducing power consumed by a high order delta sigma modulator stage having integrators with cross coupled input circuits. In method 1800, at a step 1802, a first integrator is caused to sample during a first phase of a clock and to sample and integrate during a second phase of the clock. For example, in modulator 1400, first integrator 812 samples during the first half of the period of clock 1222, and both samples and integrates during the second half of the period of clock 1222. At a step 1804, a second integrator is caused to sample and integrate during the first phase and to sample during the second phase. For example, in modulator 1400, second integrator 1104 both samples and integrates during the first half of the period of clock 1222, and samples during the second half of the period of clock 1222. At a step 1806, a reference signal voltage, which is coupled to a cross coupled feedback switched capacitor network of the integrators, is set equal to one of two power supply voltages for the high order delta sigma modulator stage. For example, in modulator 1400, where the two supply voltages are three volts and ground, refgnd 1420 can be set equal to ground.

Figure 19:
FIG. 19 is a flow chart of a method 1900 of eliminating poles from a noise transfer function of a high order delta sigma modulator stage having integrators with cross coupled input circuits.

FIG. 19 is a flow chart of a method 1900 of eliminating poles from a noise transfer function of a high order delta sigma modulator stage having integrators with cross coupled input circuits. In method 1900, at a step 1902, a first processing delay between an upstream integrator and a downstream integrator is reduced from a full cycle of a clock to a half cycle of the clock. For example, in modulator 1400, the processing delay between upstream integrator 812 and downstream integrator 1104 is reduced by half of the period of clock 1222. Such a reduction in sampling and integration delay is realized by a pipelined clock. The pipelined clock is realized by reversing the alignment of clock waveforms (i.e., $\phi_1$ 1224, $\phi_{1D}$ 1226, $\phi_2$ 1228, and $\phi_{2D}$ 1230) with the switches of network 1402 from the alignment of clock waveforms with the switches of network 1401 so that the sampling phase of network 1402 corresponds to the integration phase of network 1401, and vice versa.

At a step 1904, a second processing delay between a quantizer of the high order delta sigma modulator stage and a portion of a digital-to-analog converter of the high order delta sigma modulator stage that provides feedback to the upstream integrator is increased by the half cycle of the clock. For example, in modulator 1400, the processing delay between quantizer 814 and the portion of DAC 816 that provides feedback to upstream integrator 812 is increased by half of the period of clock 1222 by connecting a half period delay buffer 1403 between quantizer 814 and the portion of DAC 816 that provides feedback to upstream integrator 812.

Both quantized signal y[n] 828 and inverse quantized signal y[n].bar 1462 are received by half period delay buffer 1403, which produces delayed quantized signal dely[n] 1463 and delayed inverse quantized signal dely[n].bar 1464. When quantized signal y[n] 828 changes value at a given point in time, delayed quantized signal dely[n] 1463 changes value at a time a half cycle of clock 1222 later than the given time. Likewise, when inverse quantized signal y[n].bar 1462 changes value at a given point in time, delayed inverse quantized signal dely[n].bar 1464 changes value at a time a half cycle of clock 1222 later than the given time.

Delayed quantized signal dely[n] 1463 and delayed inverse quantized signal dely[n].bar 1464 are used with clock waveforms $\phi_1$ 1224 and $\phi_2$ 1228 to control the cycling of $S_{17}$ 1410, $S_{19}$ 1412, $S_{21}$ 1414, and $S_{22}$ 1415. For each of these switches, the clock waveform and quantized signal associated with the switch are applied to a logic AND gate. The output of the logic AND gate is used to control the position of the switch. Thus, each of these switches closes only when the clock waveform associated with the switch is in the on state and the quantized signal associated with the switch has value HIGHER 904. The switch opens when the clock waveform associated with the switch is in the off state or when the quantized signal associated with the switch has value LOWER 902. In this manner, modulator 1400 increases the processing delay between quantizer 814 and the portion of DAC 816 that provides feedback to upstream integrator 812 by the half cycle of clock 1222.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A delta sigma modulator, comprising:
   a first integrator having a first cross coupled switched capacitor sampling network with an input capable of receiving an analog signal;
   a second integrator coupled to said first integrator and having a second cross coupled switched capacitor sampling network;
   a quantizer coupled to said second integrator and having a first output capable of producing a modulated signal; and
   a half period delay buffer coupled between said quantizer and said first integrator;
   wherein said first integrator samples during a first phase of a clock and both samples and integrates during a second phase of said clock and said second integrator both samples and integrates during said first phase and samples during said second phase.

2. The delta sigma modulator of claim 1, wherein said first and said second cross coupled switched capacitor sampling networks are configured as differential circuits.

3. The delta sigma modulator of claim 1, wherein said first and said second cross coupled switched capacitor networks include a reference voltage that is less than an average of two power supply voltages for the delta sigma modulator.

4. The delta sigma modulator of claim 1, wherein during said first phase, a set of switches in said first cross coupled switched capacitor sampling network is closed while contemporaneously a corresponding set of switches in said second cross coupled switched capacitor sampling network is opened.

5. The delta sigma modulator of claim 1, wherein each of said first and said second cross coupled switched capacitor sampling networks comprises:
   a sampling capacitor having a first terminal and a second terminal, said first terminal coupled to an input of a corresponding cross coupled switched capacitor sampling network of said first and said second cross coupled switched capacitor sampling networks;
   a first summing junction switch having a third terminal and a fourth terminal, said third terminal coupled to said second terminal;
   an operational amplifier having a fifth terminal coupled to said fourth terminal; and
   a second summing junction switch having a sixth terminal and a seventh terminal, said sixth terminal coupled to said second terminal, said seventh terminal coupled to a reference voltage, wherein said reference voltage is less than an average of two power supply voltages for the delta sigma modulator.

6. The delta sigma modulator of claim 5, wherein said first and said second summing junction switches are metal oxide semiconductor field effect transistors (MOSFETs).

7. The delta sigma modulator of claim 6, wherein, for a given resistance of said second summing junction switch, a size of said second summing junction switch is a function of said reference voltage.

8. The delta sigma modulator of claim 1, wherein said first cross coupled switched capacitor sampling network includes a digital-to-analog converter.

9. The delta sigma modulator of claim 8, wherein said digital-to-analog converter is configured as a cross coupled feedback switched capacitor network.

10. The delta sigma modulator of claim 9, wherein said cross coupled feedback switched capacitor network is coupled to a reference signal voltage, said reference signal voltage is equal to one of two power supply voltages for the delta sigma modulator.

11. The delta sigma modulator of claim 9, wherein said half period delay buffer has a second output capable of producing a delayed modulated signal, and a third output capable of producing an inverse delayed modulated signal.

12. The delta sigma modulator of claim 11, wherein switches in said cross coupled feedback switched capacitor network are further controlled by said delayed modulated signal and said inverse delayed modulated signal.

13. The delta sigma modulator of claim 1, wherein said second cross coupled switched capacitor sampling network includes a digital-to-analog converter.

14. The delta sigma modulator of claim 13, wherein said digital-to-analog converter is configured as a cross coupled feedback switched capacitor network.

15. The delta sigma modulator of claim 14, wherein said cross coupled feedback switched capacitor network is coupled to a reference signal voltage, said reference signal voltage is equal to one of two power supply voltages for the delta sigma modulator.

16. The delta sigma modulator of claim 14, wherein said quantizer has a second output capable of producing an inverse modulated signal.

17. The delta sigma modulator of claim 16, wherein switches in said cross coupled feedback switched capacitor network are further controlled by said modulated signal and said inverse modulated signal.

18. A delta sigma modulator comprising:
   a first integrator having a first cross coupled switched capacitor sampling network with an input capable of receiving an analog sianal;
   a second integrator coupled to said first integrator and having a second cross coupled switched capacitor sampling network; and
   a quantizer coupled to said second integrator and having an output capable of producing a modulated signal;
   wherein a first processing delay between said first and said second integrators is half of a cycle of a clock, and a second processing delay between said first integrator and said quantizer is one-and-a-half of said cycle of said clock.

19. A delta sigma modulator, comprising:
   a first integrator with an input capable of receiving an analog signal;
   a second integrator coupled to said first integrator; and
   a quantizer coupled to said second integrator and having an output capable of producing a modulated signal;
   wherein said first integrator samples during a first phase of a clock and both samples and integrates during a second phase of said clock and said second integrator both samples and integrates during said first phase and samples during said second phase.

20. In a high order delta sigma modulator stage having integrators with cross coupled input circuits, a method, comprising the steps of:
   (1) causing a first integrator of the integrators to sample during a first phase of a clock and to sample and integrate during a second phase of the clock;
   (2) causing a second integrator of the integrators to sample and integrate during the first phase and to sample during the second phase; and (3) setting a reference voltage in the integrators less than an average of two power supply voltages for the high order delta sigma modulator stage.

21. In a high order delta sigma modulator stage having integrators with cross coupled input circuits, a method, comprising the steps of:

(1) causing a first integrator of the integrators to sample during a first phase of a clock and to sample and integrate during a second phase of the clock;

(2) causing a second integrator of the integrators to sample and integrate during the first phase and to sample during the second phase; and (3) setting a reference signal voltage, which is coupled to a cross coupled feedback switched capacitor network of the integrators, equal to one of two power supply voltages for the high order delta sigma modulator stage.

22. In a high order delta sigma modulator stage having integrators with cross coupled input circuits, a method, comprising the steps of:

(1) reducing a first processing delay between an upstream integrator of the integrators and a downstream integrator of the integrators from a full cycle of a clock to a half cycle of the clock; and (2) increasing a second processing delay between a quantizer of the high order delta sigma modulator stage and a portion of a digital-to-analog converter of the high order delta sigma modulator stage that provides feedback to the upstream integrator by the half cycle of the clock.

* * * * *

UNITED STATES PATENT AND TRADEMARK OFFICE
CERTIFICATE OF CORRECTION

PATENT NO. : 6,809,672 B2
DATED : October 26, 2004
INVENTOR(S) : Sandeep K. Gupta It is certified that error appears in the above-identified patent and that said Letters Patent is hereby corrected as shown below:

Column 7,
Line 58, please replace "$C_5$" with -- $C_S$ --.

Column 22,
Line 4, please replace "$C_5$" with -- $C_S$ --.

Signed and Sealed this

First Day of March, 2005

JON W. DUDAS
*Director of the United States Patent and Trademark Office*